United States Patent
Bazarsky et al.

(10) Patent No.: US 10,991,444 B1
(45) Date of Patent: Apr. 27, 2021

(54) TIERED READ REFERENCE CALIBRATION

(71) Applicant: Western Digital Technologies, Inc., San Jose, CA (US)

(72) Inventors: Alexander Bazarsky, Holon (IL); Eran Sharon, Bishon Lezion (IL); Idan Alrod, Herzliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/885,775

(22) Filed: May 28, 2020

(51) Int. Cl.
| | |
|---|---|
| *G11C 16/26* | (2006.01) |
| *G11C 29/44* | (2006.01) |
| *G11C 29/42* | (2006.01) |
| *G11C 29/02* | (2006.01) |
| *G11C 16/28* | (2006.01) |
| *G11C 29/50* | (2006.01) |
| G11C 29/12 | (2006.01) |

(52) U.S. Cl.
CPC ............ *G11C 29/44* (2013.01); *G11C 16/26* (2013.01); *G11C 16/28* (2013.01); *G11C 29/021* (2013.01); *G11C 29/42* (2013.01); *G11C 29/50004* (2013.01); *G11C 2029/1206* (2013.01); *G11C 2207/2254* (2013.01)

(58) Field of Classification Search
CPC ....... G11C 29/44; G11C 29/021; G11C 29/42; G11C 29/50004; G11C 2029/1206; G11C 2207/2254; G11C 16/26; G11C 16/28
USPC ........................................ 365/185.09, 185.21
See application file for complete search history.

(56) References Cited

U.S. PATENT DOCUMENTS

| | | | |
|---|---|---|---|
| 7,954,037 B2 * | 5/2011 | Lasser ................ | G06F 11/1072 714/763 |
| 8,374,026 B2 | 2/2013 | Sharon et al. | |
| 8,406,053 B1 | 3/2013 | Dutta et al. | |
| 8,510,636 B2 * | 8/2013 | Ruby ................ | H03M 13/6325 714/773 |
| 8,576,624 B2 | 11/2013 | Dutta et al. | |
| 8,773,922 B2 * | 7/2014 | Song ...................... | G11C 16/26 365/189.07 |
| 8,811,076 B2 | 8/2014 | Venkitachalam et al. | |
| 9,036,417 B2 | 5/2015 | Chen et al. | |
| (Continued) | | | |

OTHER PUBLICATIONS

U.S. Appl. No. 16/911,333, filed Jun. 24, 2020.

*Primary Examiner* — Son L Mai
(74) *Attorney, Agent, or Firm* — Vierra Magen Marcus LLP

(57) ABSTRACT

Calibrating read reference voltages is disclosed. In an aspect, a control die calibrates read reference voltages for reading the non-volatile memory cells. The control die is bonded to a memory die that contains memory cells. In one aspect, a tiered approach to calibrating read reference voltages is taken. For example, first the control die may attempt to determine new values for read reference voltages. If the new read reference voltages are satisfactory, then the control die may use the new read reference voltages. The control die could use one or more different techniques to determine new read reference voltages. If the new read reference voltages determined by the control die are unsatisfactory, then a memory controller in communication with the control die may calibrate the read reference voltages. By the control die determining the new read reference voltages, the memory controller is substantially less burdened with such tasks.

20 Claims, 22 Drawing Sheets

(56) References Cited

U.S. PATENT DOCUMENTS

| | | | |
|---|---|---|---|
| 9,312,031 B2 * | 4/2016 | Nishioka | G11C 29/12 |
| 9,472,298 B1 | 10/2016 | Louie et al. | |
| 9,620,202 B2 * | 4/2017 | Chen | G06F 11/1402 |
| 9,697,905 B2 | 7/2017 | Sharon et al. | |
| 9,710,325 B2 | 7/2017 | Chen et al. | |
| 9,728,263 B2 | 8/2017 | Sharon et al. | |
| 10,019,332 B1 * | 7/2018 | Sehgal | G11C 16/10 |
| 10,025,661 B1 * | 7/2018 | Shukla | G11C 11/5621 |
| 10,180,868 B2 | 1/2019 | Alhussien et al. | |
| 10,387,303 B2 | 8/2019 | Mehra et al. | |
| 10,459,644 B2 | 10/2019 | Mehra et al. | |
| 10,475,523 B2 | 11/2019 | Sharon et al. | |
| 10,509,596 B2 * | 12/2019 | Yudanov | G06F 11/3062 |
| 10,522,489 B1 | 12/2019 | Takiar et al. | |
| 10,565,123 B2 | 2/2020 | Song et al. | |
| 2017/0148510 A1 | 5/2017 | Bazarsky et al. | |
| 2019/0341375 A1 | 11/2019 | Hirano et al. | |

\* cited by examiner

Sparse parity check matrix H

N=13 variable nodes

|     | v1 | v2 | v3 | v4 | v5 | v6 | v7 | v8 | v9 | v10 | v11 | v12 | v13 |
|-----|----|----|----|----|----|----|----|----|----|-----|-----|-----|-----|
| cn1 |    | 1  |    | 1  |    |    |    |    |    |     | 1   |     | 1   |
| cn2 | 1  |    |    |    |    | 1  |    |    |    |     |     | 1   |     |
| cn3 |    |    | 1  |    | 1  | 1  |    |    |    | 1   | 1   |     |     |
| cn4 |    | 1  |    |    |    |    |    | 1  |    |     | 1   |     |     |
| cn5 |    |    |    | 1  |    |    | 1  |    |    |     |     | 1   |     |
| cn6 | 1  |    |    | 1  | 1  |    |    | 1  |    |     |     |     |     |
| cn7 |    | 1  |    |    |    |    |    | 1  | 1  |     |     |     | 1   |
| cn8 |    |    |    | 1  |    |    | 1  |    |    |     | 1   | 1   |     |
| cn9 | 1  |    | 1  | 1  |    |    |    |    |    |     |     |     | 1   |
| cn10|    |    |    |    |    |    | 1  | 1  | 1  | 1   |     |     |     |

M=10 check nodes

Sparse bipartite graph, 392 — 394, 398, 396

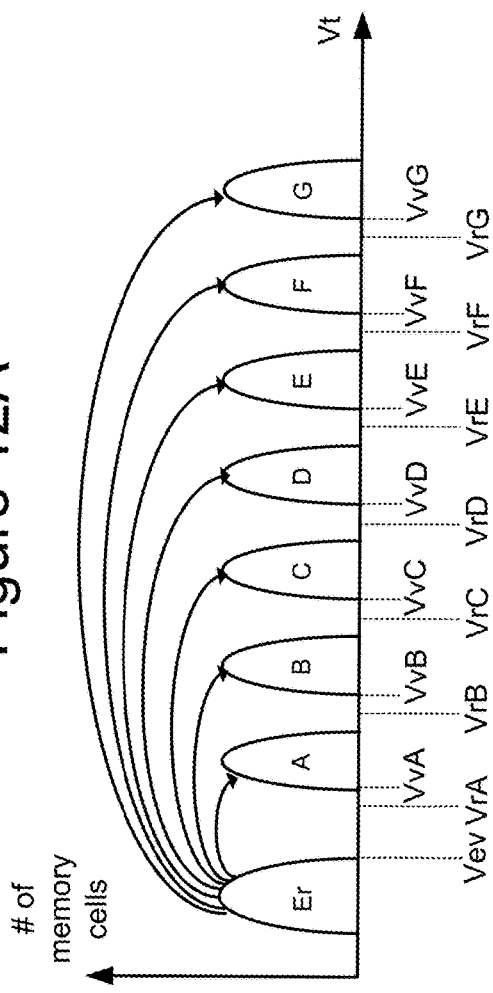
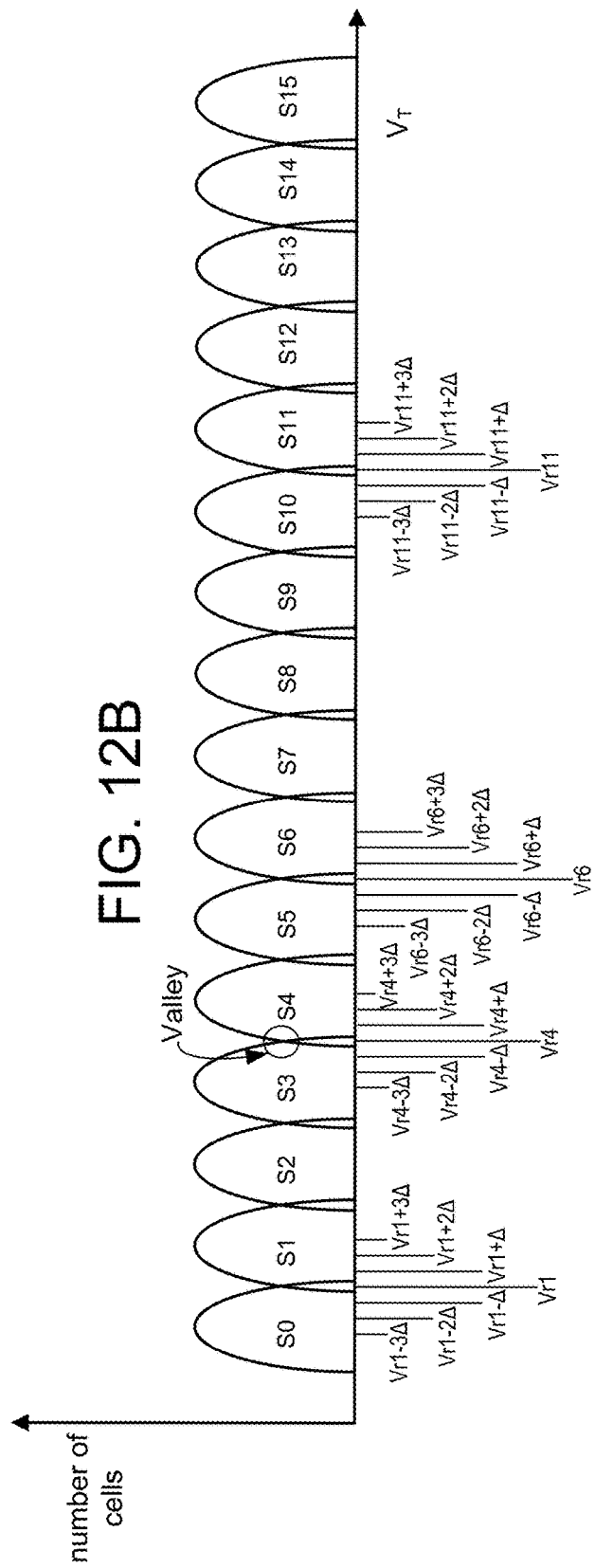

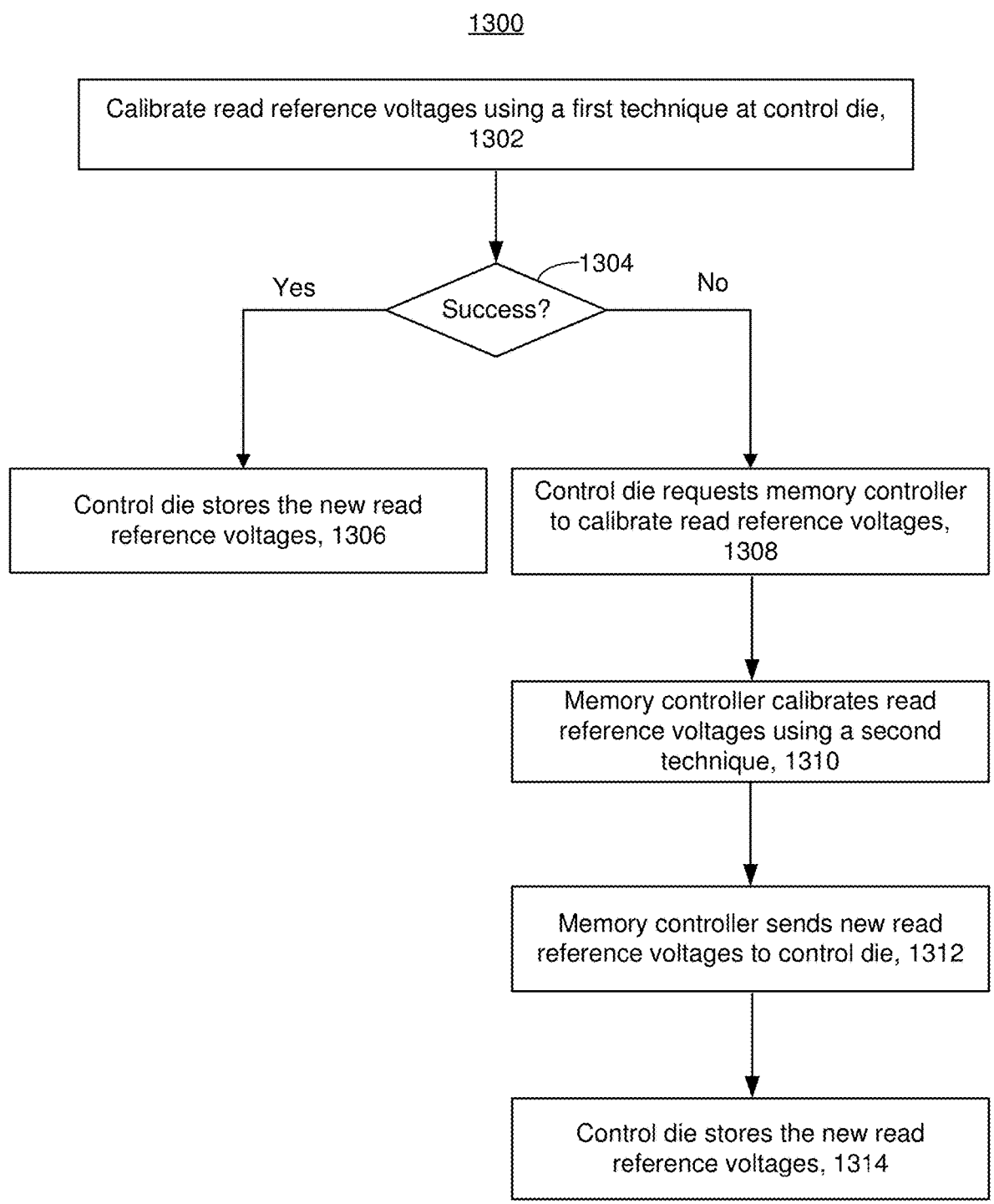

TIERED READ REFERENCE CALIBRATION

BACKGROUND

The strong growth in demand for portable consumer electronic devices is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Non-volatile semiconductor memory devices contain non-volatile memory cells that may be programmed to stored data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. To read the data back from the non-volatile memory cells it is typical to use read reference voltages in order to determine what data state a memory cell is presently in.

For a variety of reasons, it may be beneficial to modify the read reference voltages over time in order to more accurately sense the data state to which a memory cell was intended to be programmed. One reason for such modifications is that the condition of the memory cells can change between the time that the memory cells were programmed and the time the memory cells were read back. For example, for a memory cell that stores its data state based on a charge stored in the memory cell, there may be charge loss over time. Typically, such charge loss is referred to as a data retention problem. Memory cells may also suffer from program disturb, which refers to a condition (e.g., amount of charge) of the memory cell changing as a result of other memory cells being programmed. Some memory cells may suffer from read disturb, which refers to a condition (e.g., amount of charge) of the memory cell changing as a result of the memory cell being read. Another consideration is that there may be a significant difference in temperature between when the memory cells were programmed and when they are read. Some memory cells are sensitive to such temperature changes. For example, some memory cells contain a transistor, whose threshold voltage indicates the data state. The threshold voltage of a transistor typically depends on temperature.

DESCRIPTION OF THE DRAWINGS

FIG. 12A illustrates example threshold voltage distributions for the memory array when each memory cell stores three bits of data.

FIG. 12B depicts threshold voltage distributions when each memory cell stores four bits of data.

FIG. 13 is a flowchart of one embodiment of a process of operating non-volatile memory that includes an integrated memory assembly.

DETAILED DESCRIPTION

Figure 1A:
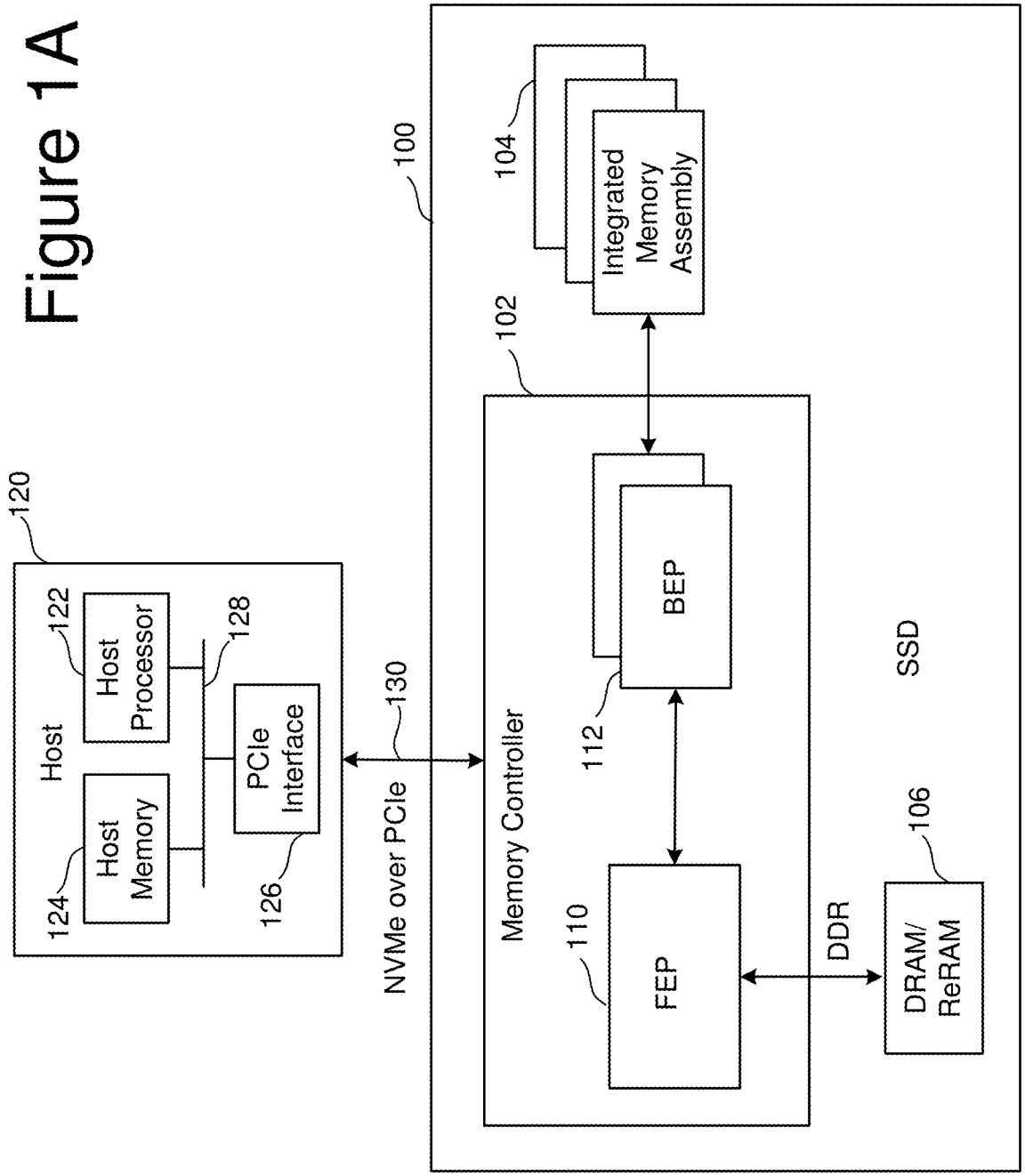
FIG. 1A is a block diagram of one embodiment of a memory system connected to a host.

The present technology will now be described with reference to the figures, which in embodiments, relate to calibrating read reference voltages for reading the non-volatile memory cells in a memory system. In an embodiment, the memory system includes an integrated memory assembly having a control die and a memory die. In some embodiments, the control die and the memory die are die bonded together with, for example bond pads. The memory die may contain non-volatile memory cells. The control die may control various operations on the memory die, such as read, write, and erase. The control die may apply read reference voltages to the memory cells in order to read data stored in the memory cells. In an embodiment, the control die calibrates read reference voltages for reading the non-volatile memory cells. In one embodiment, data and/or control signals are passed through the bond pads.

In one embodiment, a memory system includes a memory controller in communication with an integrated memory assembly. Some embodiments include a tiered approach to calibrating read reference voltages. For example, first the control die may attempt to determine new values for read reference voltages. If the new read reference voltages are satisfactory, then the control die may use the new read reference voltages. The control die could use one or more different techniques to determine new read reference voltages. If the new read reference voltages determined by the control die are unsatisfactory, then the memory controller may calibrate the read reference voltages. Whether the read reference voltages satisfactory may be based on an error metric of the codewords. Examples of error metrics include, but are not limited to, a syndrome weight of a codeword and a bit error rate of the codeword.

By the control die determining the new read reference voltages (in many cases), the memory controller is substantially less burdened with such tasks. Moreover, the communication channel between the control die and the memory controller is not burdened with transferring large amounts of data from the memory controller to determine the new read reference voltages. In some embodiments, a technique used by the memory controller may consume more time and/or power than a technique used by the control die. Stated another way, a technique used by the control die may consume less time and/or power than a technique used by the memory controller. In some embodiments, the memory controller has more processing power than the control die, and hence may be better suited to implement a more complex technique to perform a more comprehensive search for the new read reference voltages. A tiered approach allows, for example, simpler techniques to be used on the control die and more complex techniques to be used on the memory controller.

In some embodiments, the control die and the memory die are bonded together with many bond pads that permit communication between the control die and the memory die. In one embodiment, the control die is able to access data from the memory die through the bond pads. In one embodiment, each data bit and each parity bit of a codeword is read via a different bond pads. This, in effect, provides an interface that is much wider than a data bus between the integrated memory assembly and the memory controller. Therefore, transferring the codewords from the memory die to the control die is very efficient. A net effect is that having determining the new read reference voltages on the control die can be more efficient use of communication bandwidth than determining the new read reference voltages on the memory controller.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuitry on the control die has transistors that are a different size (e.g., smaller) than memory cell transistors on the memory die. The different (e.g., smaller) size of the transistors on the control die may improve performance of the control circuitry on the control die. For example, smaller transistors may use less power than larger transistors. Also, using smaller transistors allows one embodiment of a control die to have more transistors for control circuitry on the control die. Hence, the control die may be better suited to perform operations such as determining new read reference levels than the memory die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

FIG. 1A-FIG. 3B describe one example of a memory system that can be used to implement the technology disclosed herein.

FIG. 1A is a block diagram of one embodiment of a memory system 100 connected to a host 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, integrated memory assembly 104, memory system 100, memory controller 102, or the combination of memory system 100 and host 120.

In one embodiment, there are a plurality of integrated memory assemblies 104. In an embodiment, each integrated memory assembly 104 includes one or more memory die and one or more control die. Each memory die may include one or more memory structures. A control die controls operations on a memory die. For example, a control die may control read, write, and erase operations on a memory die. In one embodiment, the memory controller 102 communicates with a control die in order to instruct the control die to perform read, write, or erase operations on one or more non-volatile memory die or one or more memory structures. In one embodiment, each memory die in the integrated memory assembly 104 utilize NAND flash memory (including two dimensional NAND flash memory and/or three dimensional NAND flash memory). In other embodiments, the integrated memory assembly 104 can include other types of memory; for example, the memory package can include PCM memory.

Memory controller 102 communicates with host 120 via an interface 130 that implements NVM Express (NVMe) over PCI Express (PCIe). For working with memory system 100, host 120 includes a host processor 122, host memory 124, and a PCIe interface 126 which communicate over bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
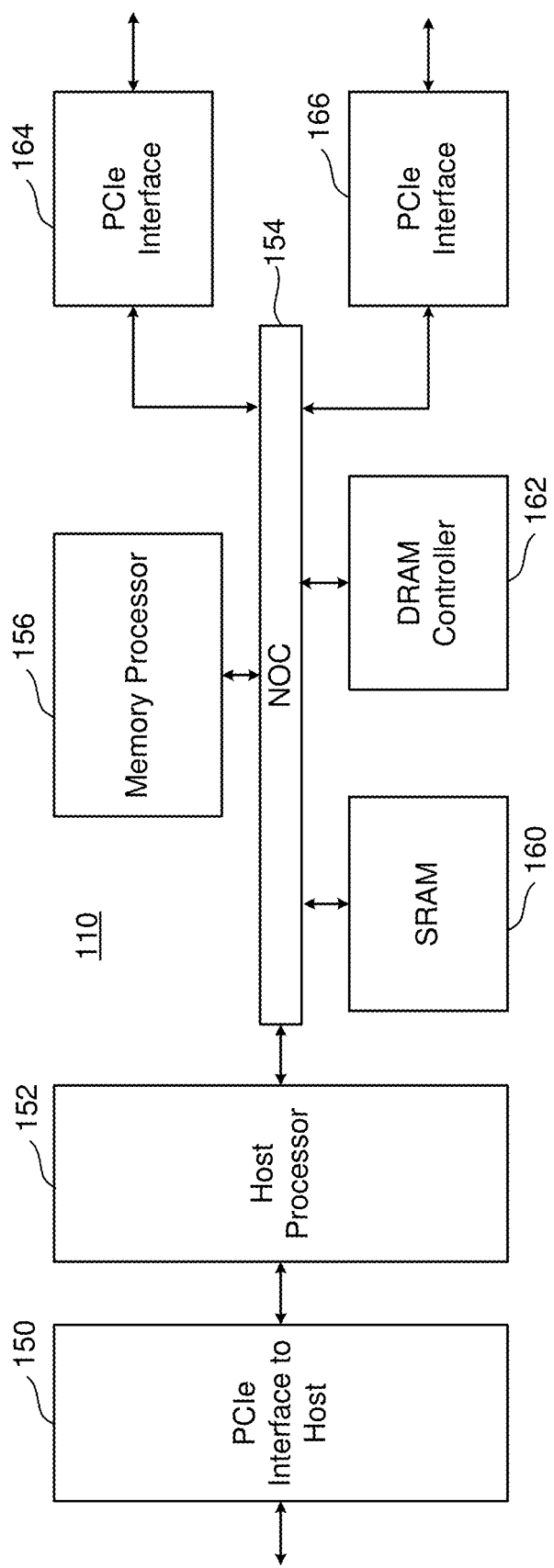
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2:
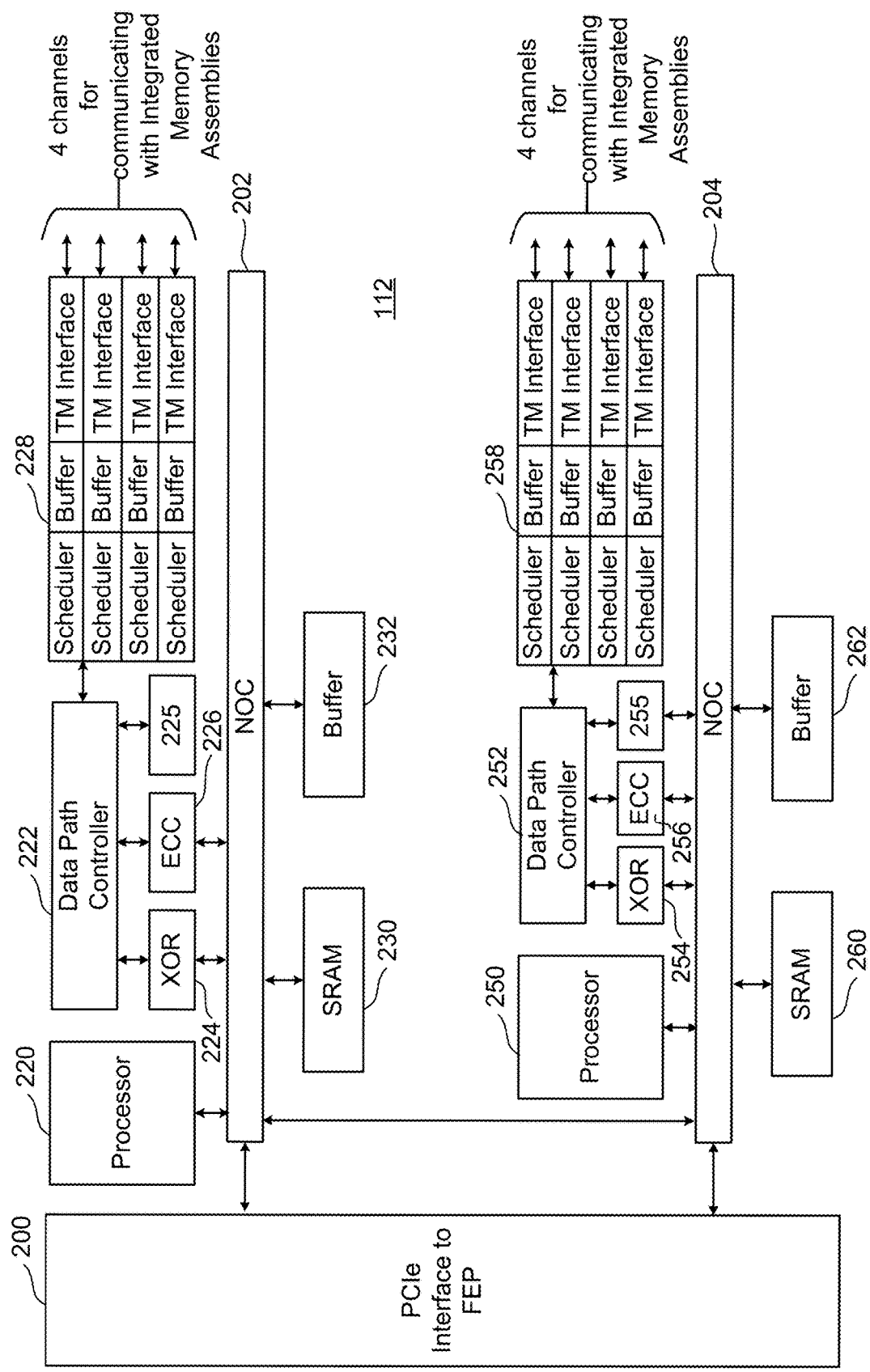
FIG. 2 is a block diagram of one embodiment of a Back End Processor Circuit.

FIG. 2 is a block diagram of one embodiment of the BEP circuit 112. FIG. 2 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. The read reference voltage calibration engines (225/255) are used to determine new read reference voltages. The read reference voltage calibration engines (225/255) may employ the ECC engine (226/256) to calibrate read reference voltages.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256, and read reference voltage calibration engines (225/255) can be implemented in software. The scheduler, buffer, and TM Interfaces are hardware circuits. In other embodiments, the memory interface (an electrical circuit for communicating with memory dies) can be a different structure than depicted in FIG. 2. Additionally, controllers with structures different than FIGS. 1B and 2 can also be used with the technology described herein.

Figure 3A:
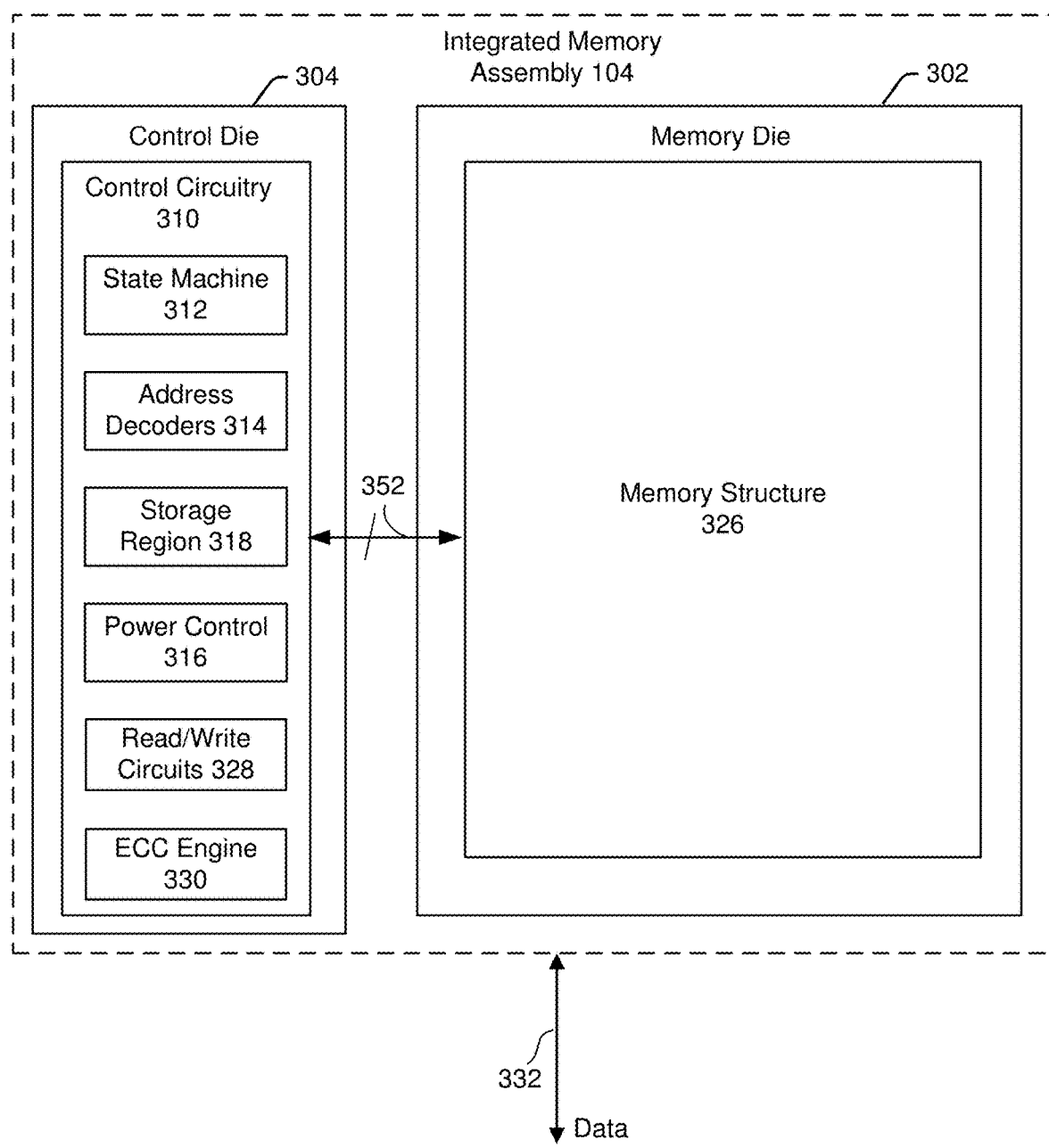
FIG. 3A is a functional block diagram of an integrated memory assembly.

FIG. 3A is a functional block diagram of one embodiment of an integrated memory assembly 104. In one embodiment, the integrated memory assembly 104 includes two types of semiconductor die (or more succinctly, "die"). Memory die 302 includes include memory structure 326. Memory structure 326 may contain non-volatile memory cells. Control die 304 includes control circuitry 310. In some embodiments, the memory die 302 and the control die 304 are bonded together, as will be described in more detail below. Typically, there are multiple control dies 304 and multiple memory dies 302 in an integrated memory assembly 104.

The control circuitry 310 performs memory operations (e.g., write, read, erase and others) on memory structure 326. The control circuitry 310 includes state machine 312, an on-chip address decoder 314, a power control circuit 316, a storage region 318, read/write circuits 328, and an ECC engine 330. In another embodiment, a portion of the read/write circuits 328 are located on control die 304, and a portion of the read/write circuits 328 are located on memory die 302. For example, the read/write circuits 328 may contain sense amplifiers. In one embodiment, the sense amplifiers are located on the control die 304. In one embodiment, the sense amplifiers are located on the memory die 302.

Herein, the term, "memory die," "memory semiconductor die," or the like, means a semiconductor die that contains non-volatile memory cells for storage. Herein, the term, "control die," "control semiconductor die," or the like, means a semiconductor die that contains control circuitry for performing memory operations on non-volatile memory cells on a memory die. Typically, numerous semiconductor die are formed from a single semiconductor (e.g., silicon) wafer.

The on-chip address decoder 314 provides an address interface between addresses used by host 120 or memory controller 102 to the hardware address used by row decoders and column decoders (not expressly depicted in FIG. 3A). Power control circuit 316 controls the power and voltages supplied to the word lines, bit lines, and select lines during memory operations. The power control circuit 316 includes voltage circuitry, in one embodiment. Power control circuit 316 may include charge pumps for creating voltages. The power control circuit 316 executes under control of the state machine 312, in one embodiment.

The read/write circuits 328 includes sense blocks (which may contain sense amplifies (SA), in some embodiments. The sense amplifies include bit line drivers, in some embodiments. The read/write circuits 328 executes under control of the state machine 312, in one embodiment. Each memory structure 326 is addressable by word lines via a row decoder (not depicted in FIG. 3A) and by bit lines via a column decoder (not depicted in FIG. 3A), in some embodiments.

The error correction code (ECC) engine 330 is configured to decode are error correct codewords. Herein, ECC engine 330 may be referred to as an on-die ECC engine. In one embodiment, the on-die ECC engine 330 is configured to encode data bits from the memory controller 102 into codewords that contain the data bits and parity bits. The control circuitry stores the codewords in the memory structure 326. In one embodiment, the on-die ECC engine 330 is configured to decode the codewords, which are read back from the memory structure 326. In some embodiments, if the on-die ECC engine 330 is successful at decoding a codeword, then the control die 304 only sends back the data bits to the memory controller 102. In some embodiments, if the on-die ECC engine 330 is not successful at decoding a codeword, then the controller ECC engine 226/256 may be used to decode the codeword. In some embodiments, the on-die ECC engine 330 is configured to calculate new read reference voltages for reading memory cells in the memory structure 326.

Any subset of components in the control circuitry 310 can be considered one or more control circuits. State machine 312, on-die ECC engine 330, read/write circuits 328, and/or memory controller 102 (or equivalently functioned circuits), in combination with all or a subset of the other circuits depicted in FIG. 3A, can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory die 302. A portion of each pathway resides in the memory die 302 and a portion of each pathway reside in the control die 304. The term pathway may be used for portion of pathways 352 that is entirely within one of the die. Thus, it may be stated that the memory die 302 has a first plurality of pathways and that the control die 304 has a second plurality of pathways. In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. Pathways 352 allow the control circuitry 310 to provide voltages to word lines, select lines, and bit lines on memory die 302, in one embodiment. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

In one embodiment, integrated memory assembly 104 includes a set of input and/or output (I/O) pins that connect to communication channel 332 (also refers to herein as a data bus). Communication channel 332 is depicted as being connected to integrated memory assembly 104 for generality. Communication channel 332 may connect to either or both of die 302 and/or 304. In one embodiment, communication channel 332 connect the memory controller 102 directly to control die 304. In one embodiment, communication channel 332 connects the memory controller 102 directly to memory die 302. If communication channel 332 connect the memory controller directly to memory die 302, then pathway 352 may be used to allow communication between the memory controller 102 and the control circuitry 310.

In one embodiment, memory structure 326 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include phase change memory (e.g., PCM), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 3A depicts one control die 304 and one memory die 302 in an integrated memory assembly 104, there may be more than one control die 304 and more than one memory die 302 in an integrated memory assembly 104.

Figure 3B:
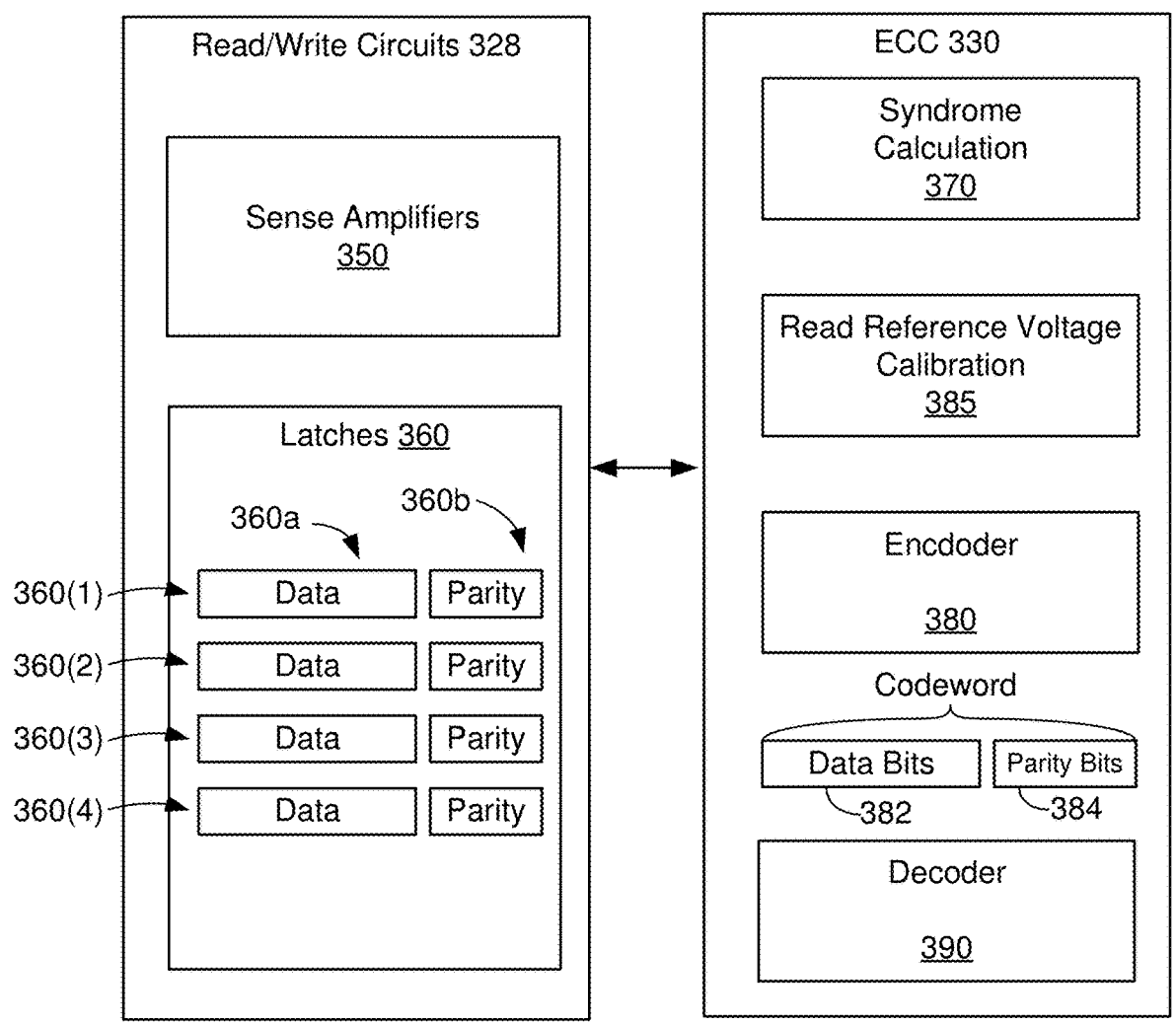
FIG. 3B is a block diagram of one embodiment of a read/write circuits and ECC of an integrated memory assembly.

FIG. 3B is a block diagram of one embodiment of the read/write circuits 328 and ECC engine 330 of the control die 304. The read/write circuits 328 have sense amplifiers 350 and latches 360. The latches 360 may include data latches 360a and parity latches 360b. In one embodiment, the data latches 360a store data bits of the codeword and the parity latches store parity bits of the codeword. It is not required that there be specific latches for data bits and for parity bits. FIG. 3B depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In another embodiment, the sense amplifiers 350 are on the memory die 302, but the latches 360 remain on the control die 304.

The on-die ECC engine 330 is able to encode data bits received from the memory controller 102. In one embodiment, the on-die ECC engine 330 forms codewords that each contain data bits and parity bits. In one embodiment, the memory controller 102 provides the codewords to the control die 304. The control circuitry 310 stores the codewords into non-volatile memory cells in the memory structure 326. Upon a request from the memory controller 102 to read data, the control circuitry 310 reads codewords from the memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

In an embodiment, upon successfully decoding a codeword, the control die 304 sends only the data bits, but not the parity bits, to the memory controller 102. Therefore, bandwidth over communication lines between the memory controller 102 and the integrated memory assembly 104 is saved. Also, substantial power may be saved. For example, the interface between the control die and the controller could be a high speed interface.

The on die ECC engine 330 includes syndrome calculation logic 370, an encoder 380, a decoder 390, and read reference voltage calibration 385. The encoder 380 is configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The encoder 380 may form a codeword, which contains data bits 382 and parity bits 384. The data bits may be provided by the memory controller 102.

In one embodiment, the data bits 382 are stored in the data latches 360a, and the parity bits 384 are stored in the parity latches 360b. Based on the bits in the latches 360, the sense amplifiers 350 may control bit line voltages in the memory structure 326 when the non-volatile memory cells are being programmed. In this manner, the codewords may be programmed into non-volatile memory cells in the memory structure 326. It will be appreciated that other voltages may also be applied to the memory structure 326, such applying a program voltage to memory cells that are selected for programming.

The decoder 390 is configured to decode the codewords that were stored in the memory die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword. In one embodiment, the decoder 390 is a relatively low power decoder, as compared to a decoder on the memory controller 102. In one embodiment, the decoder on the memory controller 102 is able to correct more bit errors in the codeword than can typically be corrected by decoder 390. Thus, decoder 390 may provide a power versus error correction capability tradeoff. For example, decoder 390 may be very efficient with respect to power consumption, but at the expense of possibly not being able to correct a high number of errors in a codeword.

In one embodiment, the decoder 390 implements a hard bit decoder. In one embodiment, the decoder 390 implements a soft bit decoder. The decoder 390 may implement both a hard bit decoder and a soft bit decoder. For example, the control die 304 may first attempt to decode a codeword with the hard bit decoder. If that fails, then the control die 304 may attempt to decode using the soft bit decoder.

In some embodiments, the decoder 390 is based on a sparse bipartite graph having bit (or variable) nodes and check nodes. The decoder 390 may pass messages between the bit nodes and the check nodes. Passing a message between a bit node and a check node is accomplished by performing a message passing computation, in some embodiments. The message passing computation may be based on believe propagation.

The syndrome calculation logic 370 is able to determine a syndrome weight for codewords. The syndrome weight refers to the number of parity check equations that are unsatisfied. Parity check equations are discussed in more detail in connection with FIGS. 3C and 3D. The initial syndrome weight of a codeword may correlate with the bit error rate (BER) of that codeword. Thus, the control die 304 may estimate a BER for a codeword based on the initial syndrome weight. In one embodiment, the syndrome logic is implemented in hardware. The syndrome weight can be determined without fully decoding a codeword. Hence, the initial syndrome weight can be calculated in less time and with less power than for decoding a codeword. In some embodiments, the control die 304 makes management decisions based on the estimated BER. For example, the control die 304 may determine what technique should be used to decode a codeword, what read reference voltages should be used to read memory cells, etc. based on the estimated BER.

The read reference voltage calibration 385 is configured to determine new read reference voltages for reading memory cells in the memory structure 326. The read reference voltage calibration 385 may use one or more different techniques to determine the new read reference voltages. In one embodiment, the read reference voltage calibration 385 analyzes threshold voltage distributions of data stored in memory cells in the memory structure 326. For example, the read reference voltage calibration 385 may perform a valley search to look for the lowest point of a valley between two adjacent threshold voltage distributions. As another example, the read reference voltage calibration 385 may determine whether the number of memory cells having a threshold voltage below a certain read reference voltage is more or less than expected. The read reference voltage calibration 385 may then determine new read reference voltages based on the analysis of the threshold voltage distributions.

In one embodiment, the read reference voltage calibration 385 may use decoder 390 to assist in determining the new read reference voltages. In one embodiment, the read reference voltage calibration 385 determines new read reference voltages based on an error metric associated with data stored in a set of memory cells in the memory structure 326. The error metric could be, for example, a syndrome weight of a codeword or an estimated bit error rate of the codeword.

Note that a technique that analyzes threshold voltage distributions may avoid use of the decoder 390, and hence may be faster and simpler than a technique that uses the decoder 390. However, analyzing threshold voltage distributions to determine new read reference voltages may not be as accurate as analyzing error metrics of codewords. For example, a valley search may be somewhat inaccurate if there is a significant difference in temperature between programming and reading the set of memory cells.

Some embodiments include a tiered approach to determining new read reference voltages. For example, first the control die 304 may attempt to determine new read reference voltages using the read reference voltage calibration 385. If the new read reference voltages are satisfactory, then the control die 304 may use the new read reference voltages to read data in the memory structure 326. The control die 304 could use one or more different techniques to determine the new read reference voltages. In one embodiment, the control die 304 first uses a technique that analyzes threshold voltage distributions. If this first technique is not successfully, then the control die 304 may use a technique that analyzes an error metric of codewords stored in the memory structure 326. If the new read reference voltages determined by the control die 304 are unsatisfactory, then the memory controller 102 may determine new read reference voltages.

By the control die 304 determining the new read levels (in many cases), the memory controller 102 is substantially less burdened with such tasks. In some embodiments, the technique used by the memory controller may consume more time and/or power than the technique used by the control die. In some embodiments, the memory controller has more processing power than the control die, and hence may be better suited to performing a more comprehensive search for the new read reference voltages.

Figures 3C, 3D:
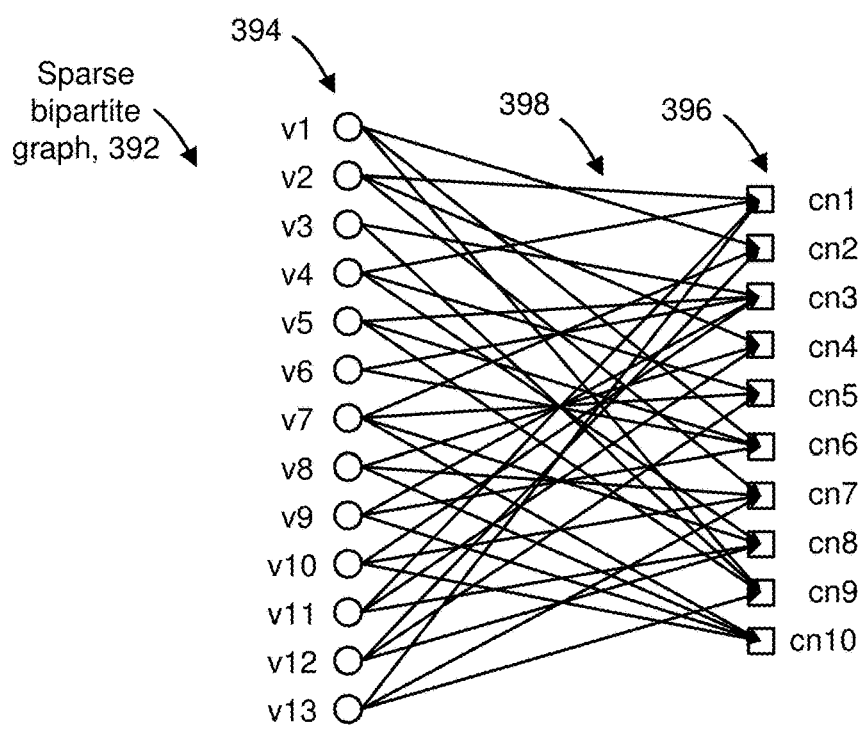
FIG. 3C depicts an example of a sparse parity check matrix H.
FIG. 3D depicts a sparse bipartite graph which corresponds to the sparse parity check matrix of FIG. 3C.

As noted above, in some embodiments, the on-die ECC engine 330 uses a spares parity check matrix. FIG. 3C depicts an example of a sparse parity check matrix H (which may also be represented as a sparse bipartite graph). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 3D depicts a sparse bipartite graph 392 which corresponds to the sparse parity check matrix of FIG. 3C. Specifically, the code can be defined by a sparse bipartite graph G=(V, C, E) with a set V of N bit nodes 394 (N=13 in this example), a set C of M check nodes 396 (M=10 in this example) and a set E (E=38 in this example) of edges 398 connecting bit nodes 394 to check nodes 396. The bit nodes correspond to the codeword bits and the check nodes correspond to parity-check constraints on the bits. A bit node 394 is connected by edges 398 to the check nodes 396 it participates in.

During decoding, one embodiment of the decoder 390 attempts to satisfy the parity checks. In this example, there are ten parity checks, as indicated by the check nodes cn1 through cn10. The first parity check at cn1 determines if $v2 \oplus v4 \oplus v11 \oplus v13 = 0$, where "$\oplus$" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12 = 0$, the third parity check at cn3 determines if $v3 \oplus v5 \oplus v6 \oplus v9 \oplus v10 = 0$, the fourth parity check at cn4 determines if $v2 \oplus v8 \oplus v11 = 0$, the fifth parity check at cn5 determines if $v4 \oplus v7 \oplus v12 = 0$, the sixth parity check at cn6 determines if $v1 \oplus v5 \oplus v6 \oplus v9 = 0$, the seventh parity check at cn7 determines if $v2 \oplus v8 \oplus v10 \oplus v13 = 0$, the eighth parity check at cn8 determines if $v4 \oplus v7 \oplus v11 \oplus v12 = 0$, the ninth parity check at cn9 determines if $v1 \oplus v3 \oplus v5 \oplus v13 = 0$ and the tenth parity check at cn10 determines if $v7 \oplus v8 \oplus v9 \oplus v10 = 0$.

In one embodiment, the decoder 390 uses an iterative probabilistic decoding process involving iterative message passing decoding algorithms. These algorithms operate by exchanging messages between bit nodes and check nodes over the edges of the underlying bipartite graph representing the code.

The decoder 390 may be provided with initial estimates of the codeword bits (based on the content that is read from the memory structure 326). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

Figure 4:
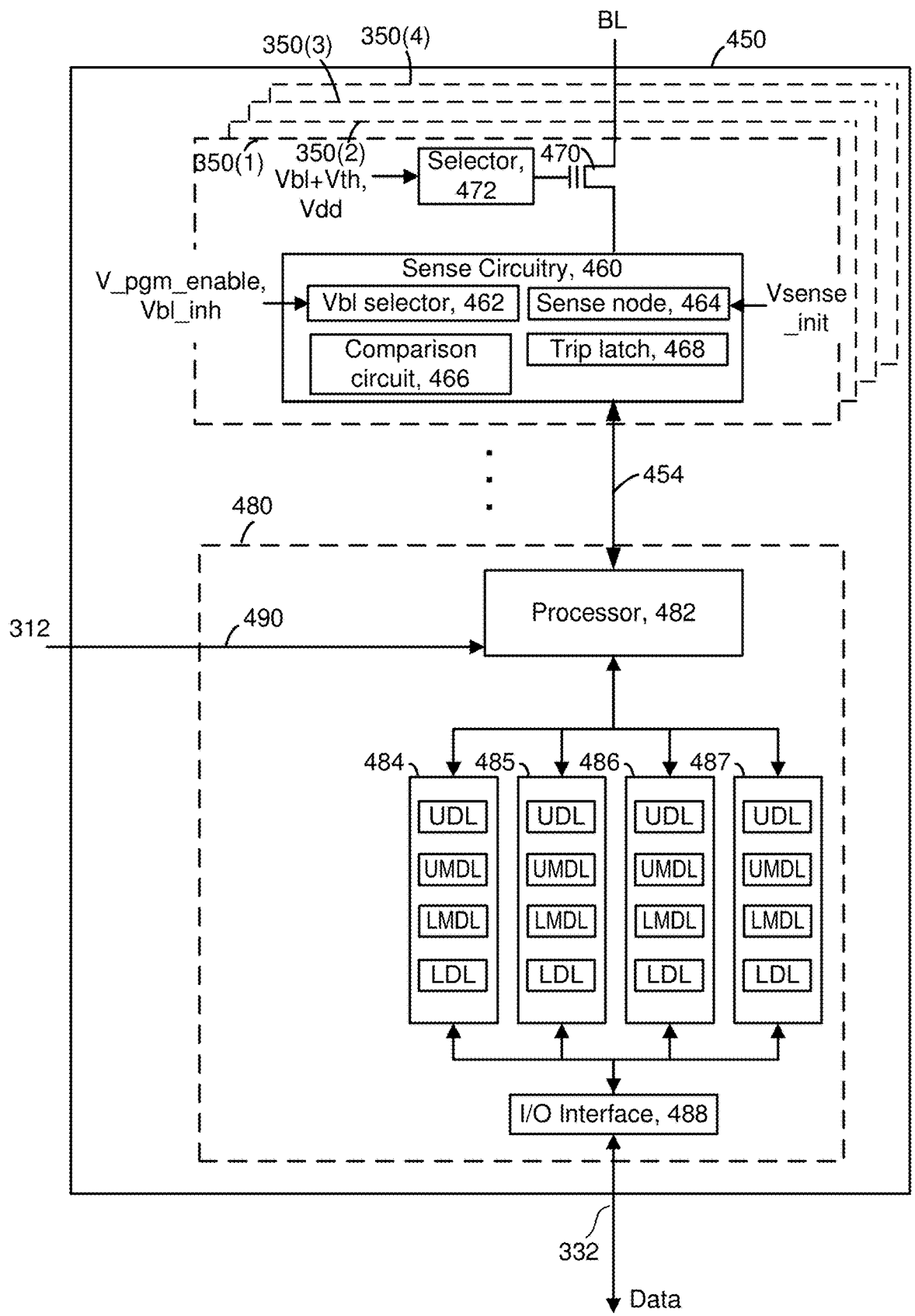
FIG. 4 is a block diagram depicting one embodiment of a sense block.

FIG. 4 is a block diagram depicting one embodiment of a sense block 450. The sense block is part of the read/write circuits 328. An individual sense block 450 is partitioned into one or more core portions, referred to as sense circuits or sense amplifiers 350(1)-350(4), and a common portion, referred to as a managing circuit 480. In one embodiment, there will be a separate sense circuit for each bit line/NAND string and one common managing circuit 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

The managing circuit 480 comprises a processor 482, four example sets of data latches 484, 485, 486, 487 and an I/O Interface 488 coupled between the sets of data latches and data bus 332 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The processor 482 performs computations, such as to determine the data stored in the sensed memory cell and store the determined data in the set of data latches. Each set of data latches 484-487 is used to store data bits determined by processor 482 during a read operation, and to store data bits imported from the data bus 332 during a program operation which represent write data meant to be programmed into the memory. I/O interface 488 provides an interface between data latches 484-487 and the data bus 332.

The processor 482 may also be used to determine what voltage to apply to the bit line, based on the state of the latches.

During reading, the operation of the system is under the control of state machine 312 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine via input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 5A:
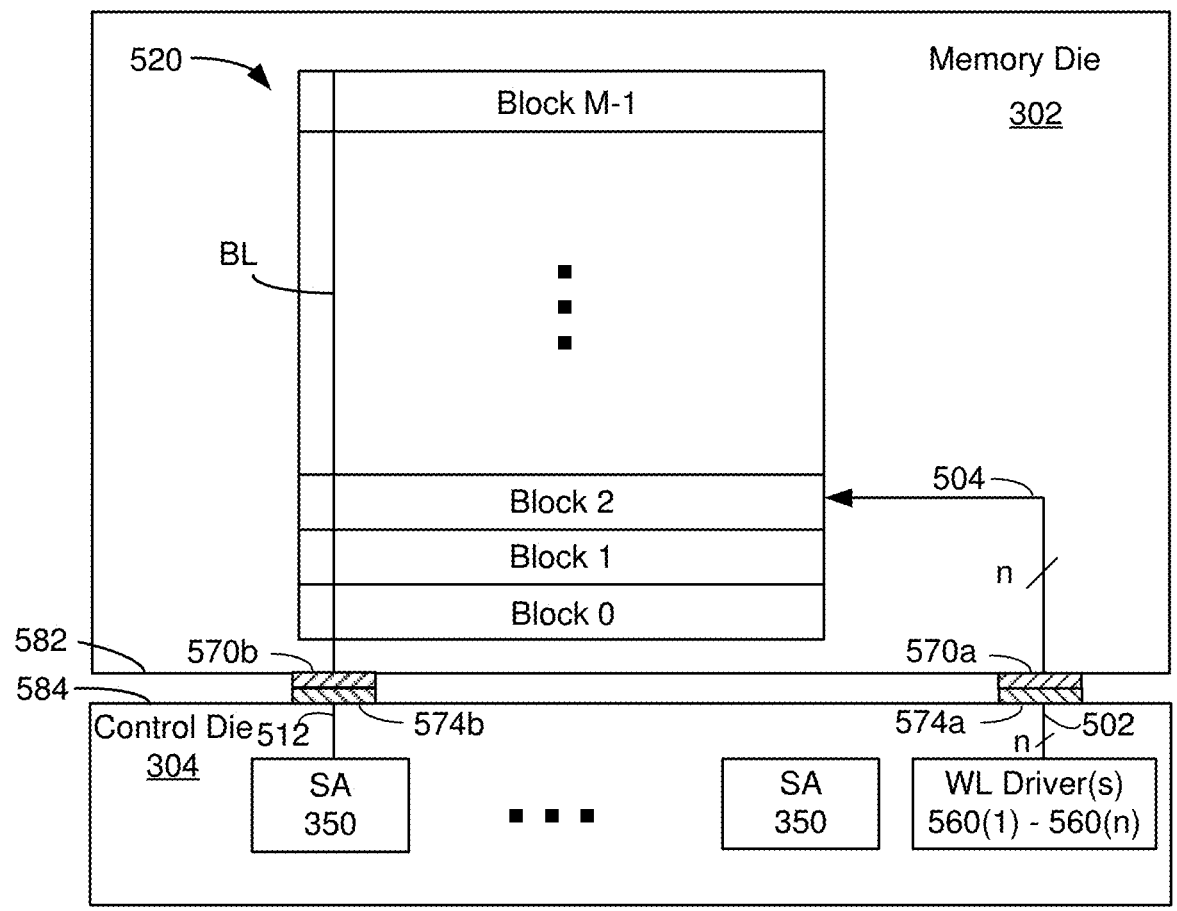
FIG. 5A is a block diagram of an embodiment of an integrated memory assembly.

FIG. 5A is a block diagram of one embodiment of an integrated memory assembly 104. FIG. 5A depicts further details of one embodiment of the integrated memory assembly 104 of FIG. 1A or 3A. Memory die 302 contains a plane 520 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 5A, Block 0 and Block M−1 of plane 520 are at the edges of the memory structure (or otherwise referred to as being located in an edge region/section of the memory structure).

The control die 304 includes a number of sense amplifiers (SA) 350, in one embodiment. Each sense amplifier 350 is connected to one bit line, in this example. The sense amplifier contains a bit line driver, in one embodiment. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 560(1)-560(n). The word line drivers 560 are configured to provide voltages to word lines. In this example, there are "n" word lines per block of memory cells. In one embodiment, one of the blocks in the plane 520 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 560 provide voltages to the word lines in a first selected block (e.g., Block 2) in memory die 302. The control die 304 may also include charge pumps, voltage generators, and the like, which may be used to provide voltages for the word line drivers 560 and/or the bit line drivers.

The memory die 302 has a number of bond pads 570a, 570b on a first major surface 582 of memory die 302. There may be "n" bond pads 570a, to receive voltages from a corresponding "n" word line drivers 560(1)-560(n). There may be one bond pad 570b for each bit line associated with plane 520. The reference numeral 570 will be used to refer in general to bond pads on major surface 582.

In some embodiments, each data bit and each parity bit of a codeword are transferred through a different bond pad pair 570b, 574b. The bits of the codeword may be transferred in parallel over the bond pad pairs 570b, 574b. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 574a, 574b on a first major surface 584 of control die 304. There may be "n" bond pads 574a, to deliver voltages from a corresponding "n" word line drivers 560(1)-560(n) to memory die 302a. There may be one bond pad 574b for each bit line associated with plane 520. The reference numeral 574 will be used to refer in general to bond pads on major surface 582. Note that there may be bond pad pairs 570a/574a and bond pad pairs 570b/574b. In some embodiments, bond pads 570 and/or 574 are flip-chip bond pads.

The pattern of bond pads 570 matches the pattern of bond pads 574, in one embodiment. Bond pads 570 are bonded (e.g., flip chip bonded) to bond pads 574, in one embodiment. Thus, the bond pads 570, 574 electrically and physically couple the memory die 302 to the control die 304. Also, the bond pads 570, 574 permit internal signal transfer between the memory die 302 and the control die 304. Thus, the memory die 302 and the control die 304 are bonded together. Although FIG. 5A depicts one control die 304 bonded to one memory die 302, in one embodiment, one control die 304 is bonded to two memory dies 302.

Herein, "internal signal transfer" means signal transfer between the control die 304 and the memory die 302. The internal signal transfer permits the circuitry on the control die 304 to control memory operations in the memory die 302. Therefore, the bond pads 570, 574 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 570, 574 may be formed for example of copper, aluminum and alloys thereof. There may be a liner between the bond pads 570, 574 and the major surfaces (582, 584). The liner may be formed for example of a titanium/titanium nitride stack. The bond pads 570, 574 and liner may be applied by vapor deposition and/or plating techniques. The bond pads and liners together may have a thickness of 720 nm, though this thickness may be larger or smaller in further embodiments.

Figure 10A:
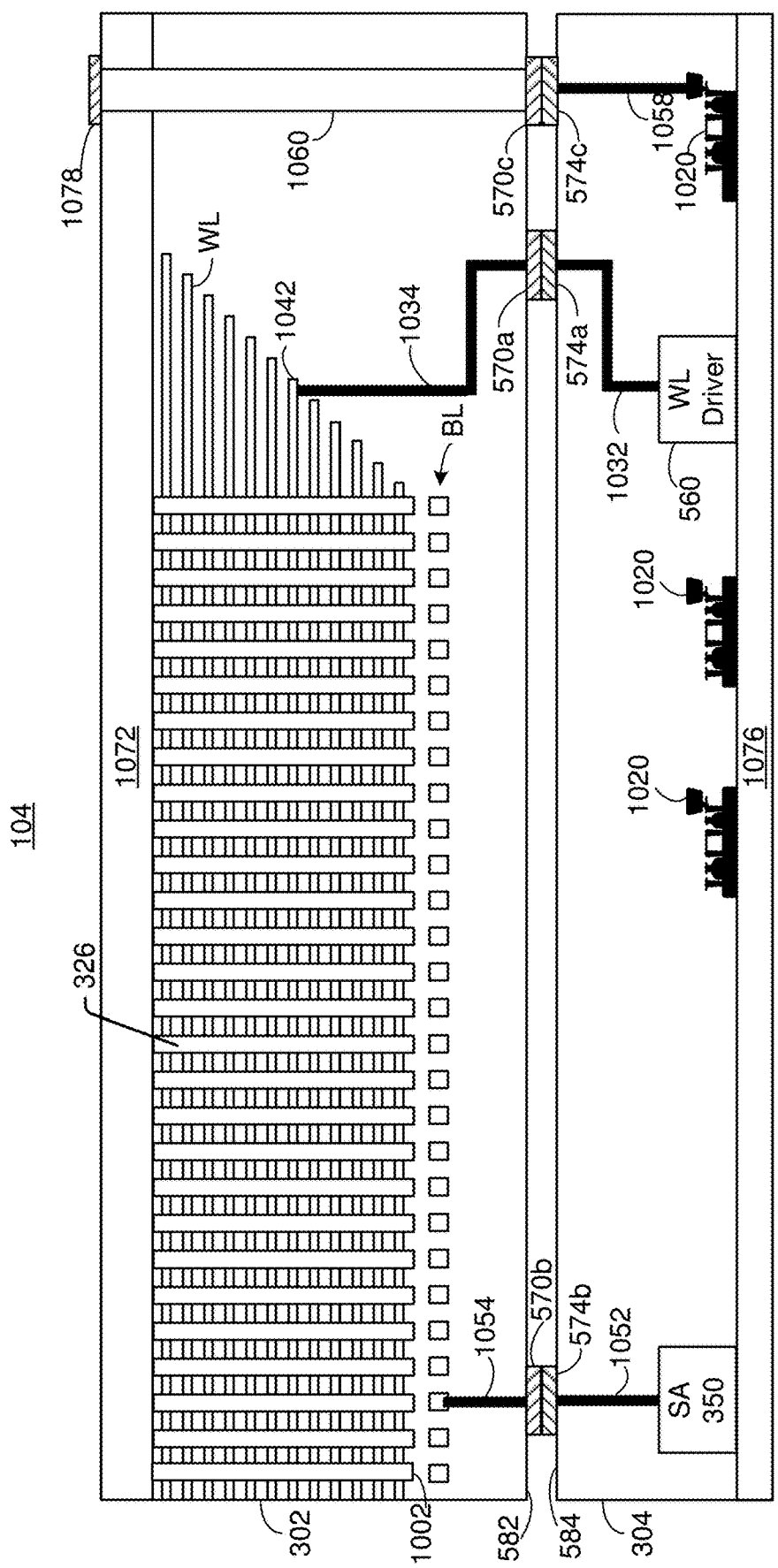
FIG. 10A is a diagram of one embodiment of an integrated memory assembly.

Metal interconnects and/or vias may be used to electrically connect various elements in the dies to the bond pads 570, 574. Several conductive pathways, which may be implemented with metal interconnects and/or vias are depicted. For example, a sense amplifier 350 may be electrically connected to bond pad 574b by pathway 512. There may be thousands of such sense amplifiers, pathways, and bond pads. Note that the BL does not necessarily make direct connection to bond pad 570b. The word line drivers 560 may be electrically connected to bond pads 574a by pathways 502. Note that pathways 502 may comprise a separate conductive pathway for each word line driver 560(1)-560(n). Likewise, there may be a separate bond pad 574a for each word line driver 560(1)-560(n). The word lines in block 2 of the memory die 302 may be electrically connected to bond pads 570a by pathways 504. In FIG. 5A, there are "n" pathways 504, for a corresponding "n" word lines in a block. There may be a separate pair of bond pads 570a, 574a for each pathway 504. FIG. 10A depicts further details of one embodiment of an integrated memory assembly 104 having metal interconnects and/or vias.

Figure 5B:
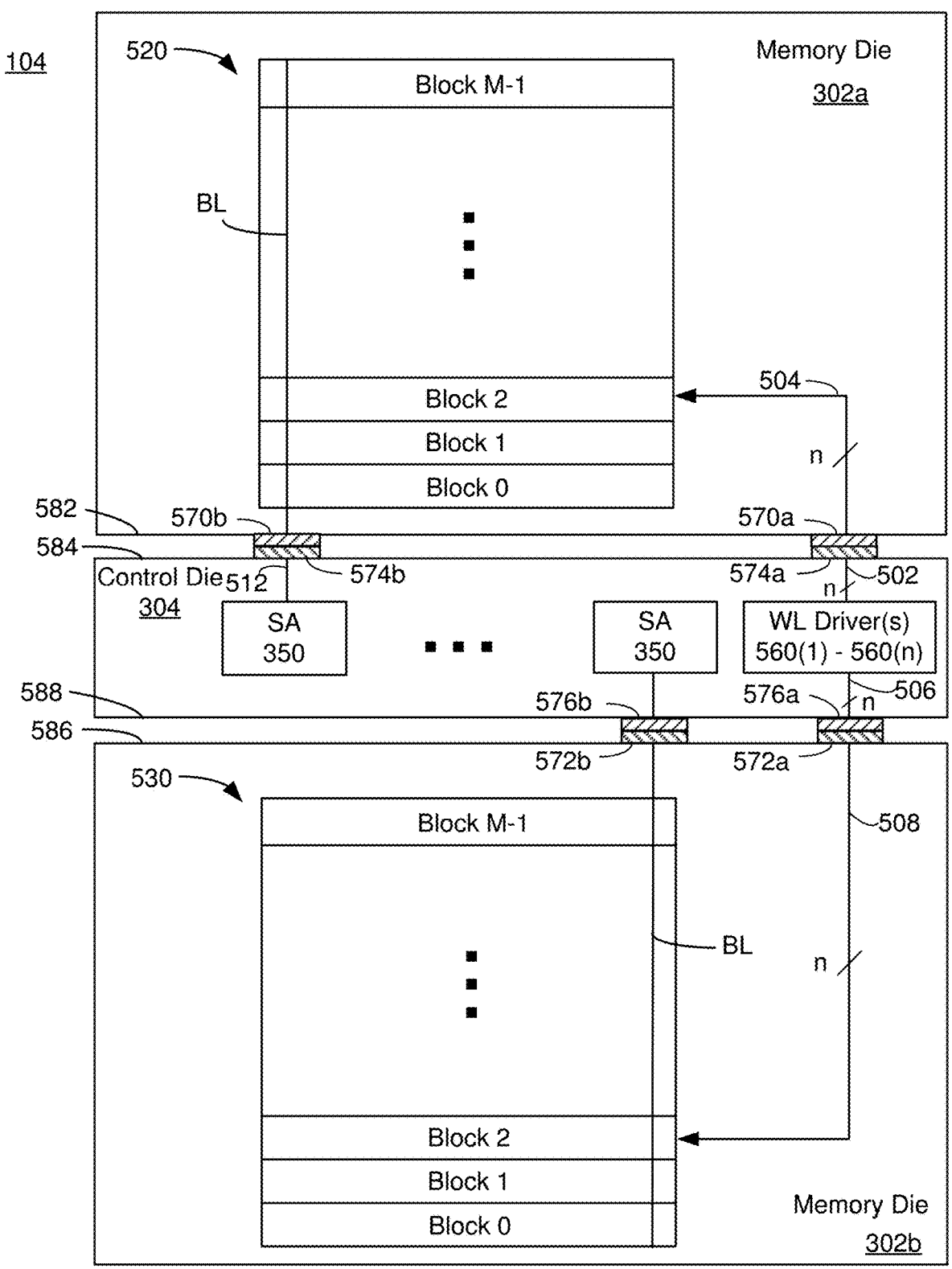
FIG. 5B is a block diagram of an embodiment of an integrated memory assembly in which a control die controls two memory dies.

FIG. 5B depicts another embodiment of an integrated memory assembly 104 in which one control die 304 may be used to control two memory die 302a, 302b. The control die 304 has a number of a number of bond pads 574(a), 574(b) on a first major surface 584, as discussed in connection with FIG. 5A. The control die 304 has a number of a number of bond pads 576(a), 576(b) on a second major surface 588. There may be "n" bond pads 576(a) to deliver voltages from a corresponding "n" word line drivers 560(1)-560(n) to memory die 302b. The word line drivers 560 may be electrically connected to bond pads 576a by pathways 506. There may be one bond pad 576b for each bit line associated with plane 530 on memory die 302b. The reference numeral 576 will be used to refer in general to bond pads on major surface 588.

The second memory die 302b has a number of bond pads 572(a), 572(b) on a first major surface 586 of second memory die 302b. There may be "n" bond pads 572(a), to receive voltages from a corresponding "n" word line drivers 560(1)-560(n). The word lines in plane 530 may be electrically connected to bond pads 572a by pathways 508. There may be one bond pad 572(b) for each bit line associated with plane 530. The reference numeral 572 will be used to refer in general to bond pads on major surface 586. Note that there may be bond pad pairs 572(a)/576(a) and bond pad pairs 572(b)/576(b). In some embodiments, bond pads 572 and/or 576 are flip-chip bond pads.

In an embodiment, the "n" word line drivers 560(1)-560(n) are shared between the two memory die 302a, 302b. For example, a single word line driver may be used to provide a voltage to a word line in memory die 302a and to a word line in memory die 302b. However, it is not required that the word line drivers 560 are shared between the memory dies 302a, 302b.

Figure 6A:
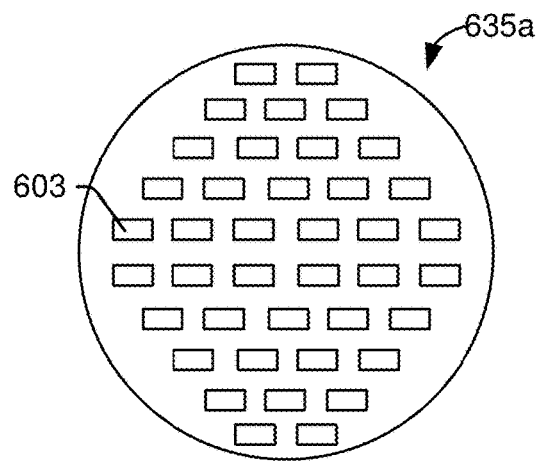
FIGS. 6A and 6B are top views of semiconductor wafers.

FIG. 6A is a top view of a semiconductor wafer 635a from which multiple control die 304 may be formed. The wafer 635a has numerous copies of integrated circuits 603. Each of the integrated circuits 603 contains the control circuitry 310 (see FIG. 3A), in one embodiment. The wafer 635a is diced into semiconductor dies, each containing one of the copies of the integrated circuits 603, in some embodiments. Therefore, numerous control semiconductor dies 304 may be formed from the wafer 635a. Also note that even before the wafer 635a is diced, as the term "control semiconductor die" is used herein, each region in which an integrated circuit 603 resides may be referred to as a control semiconductor die 304.

Figure 6B:
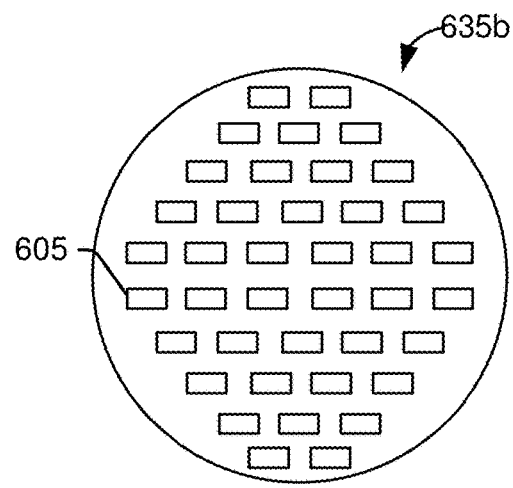

FIG. 6B is a top view of a semiconductor wafer 635b from which multiple memory die 302 may be formed. The wafer 635b has numerous copies of integrated circuits 605. Each of the integrated circuits 605 contains memory structure 326 (see FIG. 3A), in one embodiment. The wafer 635b is diced into semiconductor dies, each containing one of the copies of the integrated circuits 605, in some embodiments. Therefore, numerous memory semiconductor dies 302 may be formed from the wafer 635b. Also note that even before the wafer 635b is diced, as the term "memory semiconductor die" is used herein, each region in which an integrated circuit 605 resides may be referred to as a memory semiconductor die 302.

The semiconductor wafers 635 may start as an ingot of monocrystalline silicon grown according to either a CZ, FZ or other process. The semiconductor wafers 635 may be cut and polished on major surfaces to provide smooth surfaces. The integrated circuits 603, 605 may be formed on and/or in the major surfaces. The dicing of the wafers 635 into semiconductor dies may occur before or after bonding. In one embodiment, the two wafers 635, 635b are bonded together. After bonding the two wafers together, dicing is performed. Therefore, numerous integrated memory assemblies 104 may be formed from the two wafers 635. In another embodiment, the two wafers 635a, 635b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

The dicing of the wafers 635 into semiconductor dies may occur before or after bonding. In one embodiment, the two wafers 635, 635b are bonded together. After bonding the two wafers together, dicing is performed. Therefore, numerous integrated memory assemblies 104 may be formed from the two wafers 635. In another embodiment, the two wafers 635a, 635b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

Figure 7:
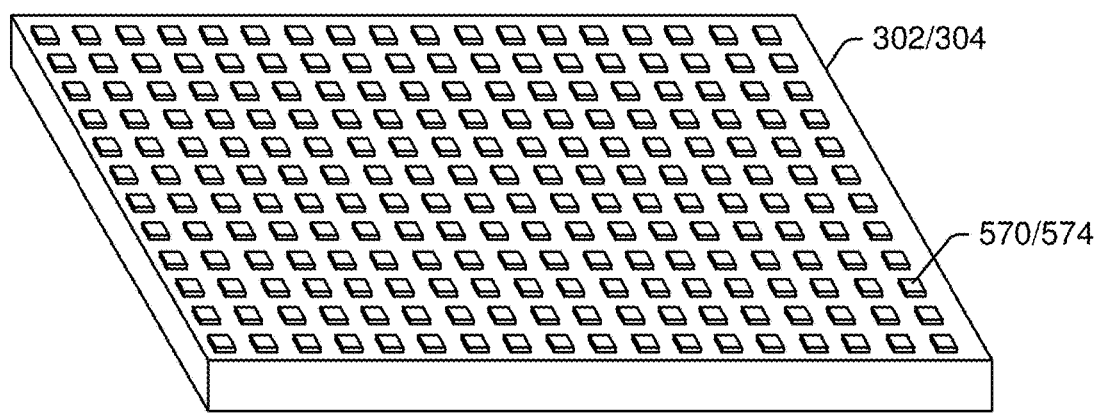
FIG. 7 depicts an example pattern of bond pads on a planar surface of a semiconductor die.

As has been briefly discussed above, the control die 304 and the memory die 302 may be bonded together. Bond pads on each die 302, 304 may be used to bond the two dies together. Recall that FIG. 5 depicts one example of bonds 570 on the memory die 302, as well as bonds 574 on the semiconductor die 304. FIG. 7 depicts an example pattern of bond pads on a planar surface of a semiconductor die. The semiconductor die could be memory die 302 or control die 304. The bond pads could be any of bond pads 570 or 574, as appropriate for the semiconductor die. There may be many more bond pads than are depicted in FIG. 7. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 570, 574 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 8A:
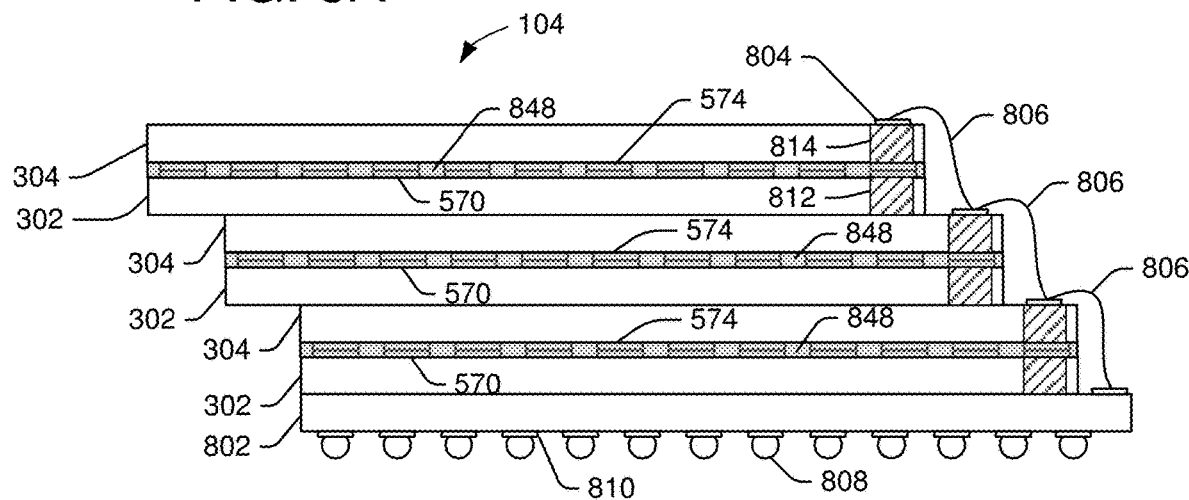
FIG. 8A depicts a side view of an embodiment of an integrated memory assembly stacked on a substrate.

As noted herein, there may be more than one control die 304 and more than one memory die 302 in an integrated memory assembly 104. In some embodiments, the integrated memory assembly 104 includes a stack of multiple control die 304 and multiple memory die 302. FIG. 8A depicts a side view of an embodiment of an integrated memory assembly 104 stacked on a substrate 802. The integrated memory assembly 104 has three control die 304 and three memory die 302. Each control die 304 is bonded to one of the memory die 302. Some of the bond pads 570, 574, are depicted. There may be many more bond pads. A space between two dies 302, 304 that are bonded together is filled with a solid layer 848, which may be formed from epoxy or other resin or polymer. This solid layer 848 protects the electrical connections between the dies 302, 304, and further secures the dies together. Various materials may be used as solid layer 848, but in embodiments, it may be Hysol epoxy resin from Henkel Corp., having offices in California, USA.

The integrated memory assembly 104 may for example be stacked with a stepped offset, leaving the bond pads 804 at each level uncovered and accessible from above. Wire bonds 806 connected to the bond pads 804 connect the control die 304 to the substrate 802. A number of such wire bonds may be formed across the width of each control die 304 (i.e., into the page of FIG. 8A).

A memory die through silicon via (TSV) 812 may be used to route signals through a control die 304. A control die through silicon via (TSV) 814 may be used to route signals through a memory die 302. The TSVs 812, 814 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package. The solder balls 808 may form a part of the interface between the integrated memory assembly 104 and the memory controller 102.

Figure 8B:
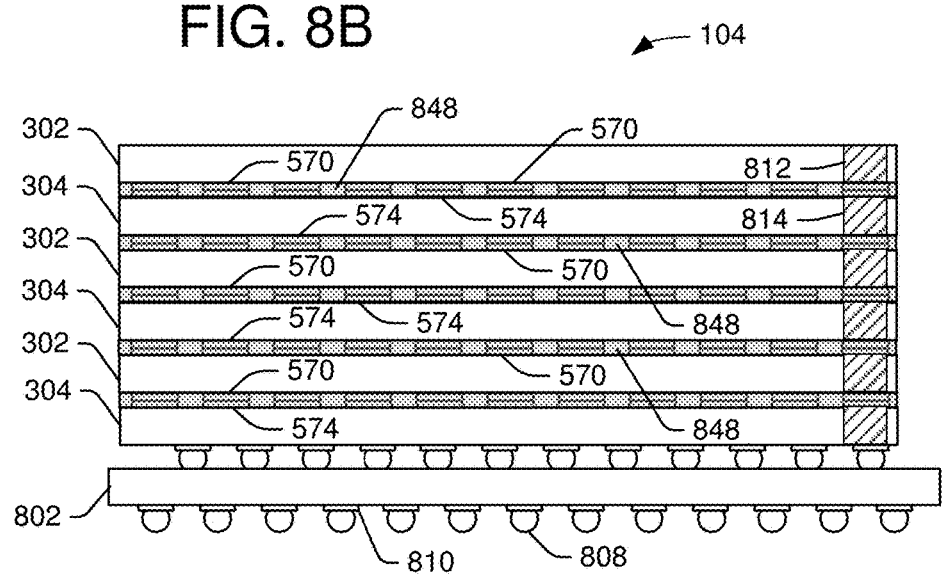
FIG. 8B depicts a side view of an embodiment of an integrated memory assembly stacked on a substrate.

FIG. 8B depicts a side view of an embodiment of an integrated memory assembly 104 stacked on a substrate 802. The integrated memory assembly 104 has three control die 304 and three memory die 302. In this example, each control die 304 is bonded to at least one memory die 302. Optionally, a control die 304 may be bonded to two memory die 302. For example, two of the control die 304 are bonded to a memory die 302 above the control die 304 and a memory die 302 below the control die 304.

Some of the bond pads 570, 574 are depicted. There may be many more bond pads. A space between two dies 302, 304 that are bonded together is filled with a solid layer 848, which may be formed from epoxy or other resin or polymer. In contrast to the example in FIG. 8A, the integrated memory assembly 104 in FIG. 8B does not have a stepped offset. A memory die through silicon via (TSV) 812 may be used to route signals through a memory die 302. A control die through silicon via (TSV) 814 may be used to route signals through a control die 304.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package.

Figure 9:
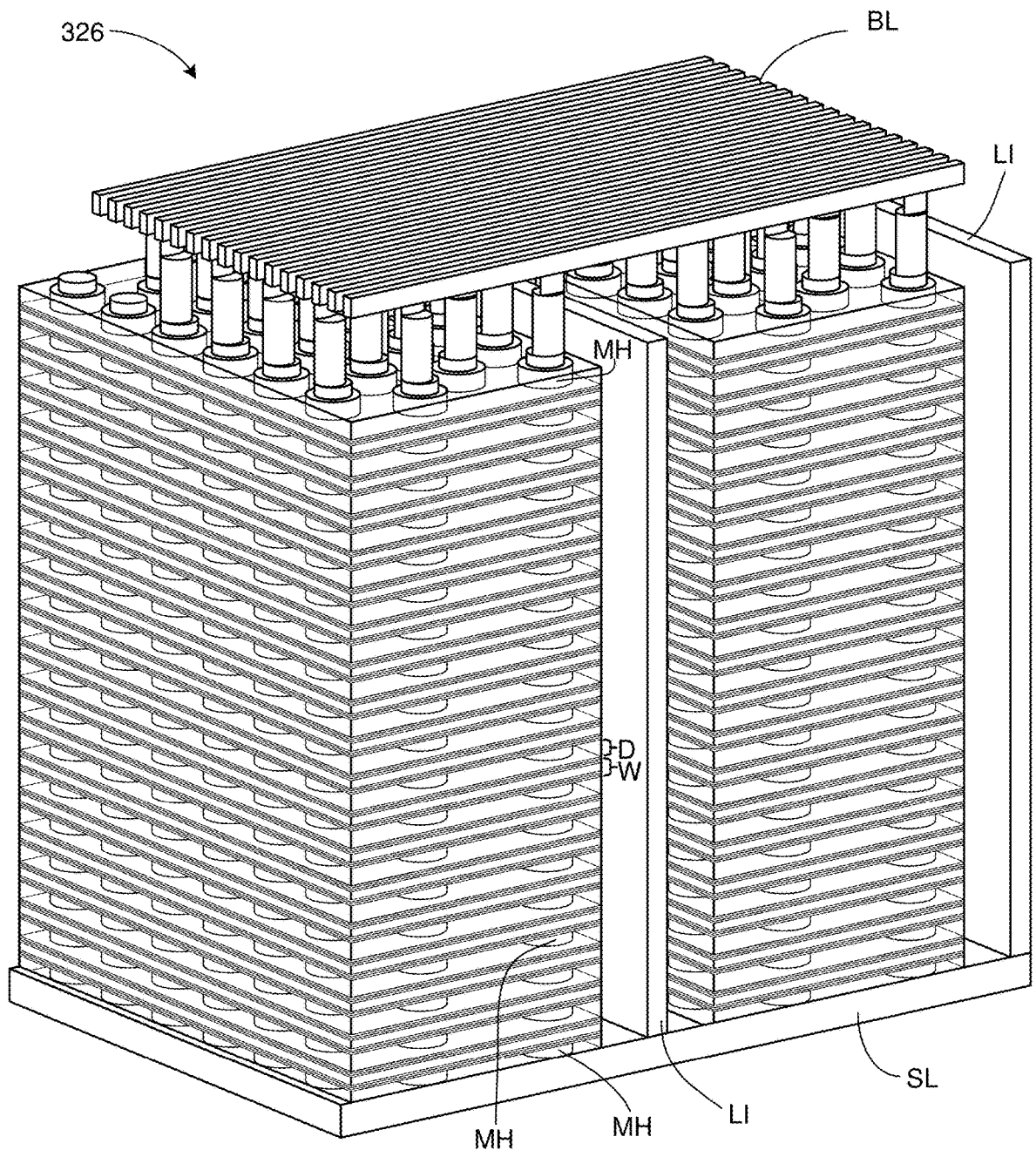
FIG. 9 is a perspective view of a portion of one example embodiment of a monolithic three dimensional memory array that can comprise memory structure.

FIG. 9 is a perspective view of a portion of one example embodiment of a monolithic three dimensional memory array that can comprise memory structure 326, which includes a plurality non-volatile memory cells. For example, FIG. 9 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 9, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

FIG. 10A is a diagram of one embodiment of an integrated memory assembly 104. In an embodiment depicted in FIG. 10A, memory die 302 is bonded to control die 304. This bonding configuration is similar to an embodiment depicted in FIG. 5A. Note that although a gap is depicted between the pairs of adjacent dies, such a gap may be filled with an epoxy or other resin or polymer. FIG. 10A shows additional details of one embodiment of pathways 352.

The memory die includes a memory structure 326. Memory structure 326 is adjacent to substrate 1072 of memory die 302. The substrate 1072 is formed from a portion of a silicon wafer, in some embodiments. In this example, the memory structure 326 include a three-dimensional memory array. The memory structure 326 has a similar structure as the example depicted in FIG. 9. There are a number of word line layers (WL), which are separated by dielectric layers. The dielectric layers are represented by gaps between the word line layers. Thus, the word line layers and dielectric layers form a stack. There may be many more word line layers than are depicted in FIG. 10A. As with the example of FIG. 9, there are a number of columns that extend through the stack. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The pathway from the word line driver 560 to the word line 1042 includes conductive pathway 1032, bond pad 574a, bond pad 570a, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 10A) provide voltages to other word lines. Thus, there are additional bond pad 574a, 570a in addition to bond pads 574a, 570a. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310 (see FIG. 3A). In some embodiments, sense amplifiers 350, word line driver(s) 560, and/or other circuitry 1020 comprise CMOS circuits.

There is an external signal path that allows circuitry on the control die 304 to communicate with an entity external to the integrated memory assembly 104, such as memory controller 102. Therefore, circuitry 1020 on the control die 304 may communicate with, for example, memory controller 102 (see FIG. 3A). Optionally, circuitry on the control die 304 may communicate with, for example, host 120. The external pathway includes via 1058 in control die 304, bond pad 574c, bond pad 570c, through silicon via (TSV) 1060, and external pad 1078. The TSV 1060 extends through substrate 1072.

The TSV 1060, may be formed before, during or after formation of the integrated circuits in the semiconductor dies 302, 304. The TSV may be formed by etching holes through the wafers. For example, holes may be etched through substrate 1072. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to an embodiment depicted in FIG. 10A are possible. One modification is for sense amplifiers 350 to be located on memory die 302.

Figure 10B:
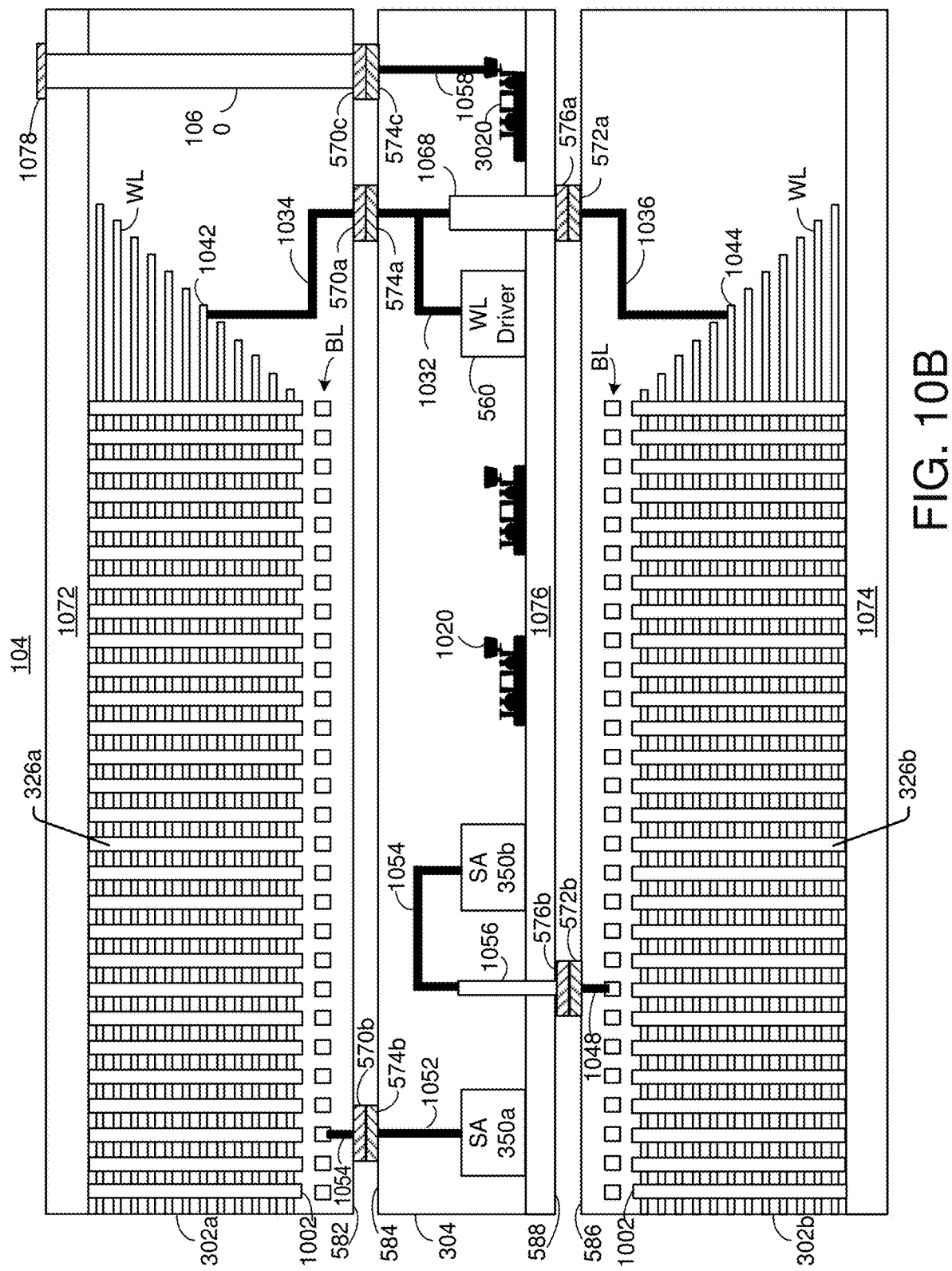
FIG. 10B is a diagram of one embodiment of an integrated memory assembly in which one control die controls two memory die.

FIG. 10B is a diagram of one embodiment of an integrated memory assembly 104. This bonding configuration is similar to an embodiment depicted in FIG. 5B. The configuration in FIG. 10B adds an extra memory die relative to the configuration in FIG. 10A. Hence, similar reference numerals are used for memory die 302a in FIG. 10B, as were used for memory die 302 in FIG. 10A. In an embodiment depicted in FIG. 10B, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1072 of memory die 302a. Memory structure 326b is adjacent to substrate 1074 of memory die 302b. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302a and a second word line 1044 in memory die 302b. The pathway from the word line driver 560 to the second word line 1044 includes conductive pathway 1032, through silicon via (TSV) 1068, bond pad 576a, bond pad 572a, and conductive pathway 1036. Other word line drivers (not depicted in FIG. 10B) provide voltages to other word lines.

Sense amplifier 350a is in communication with a bit line in memory die 302a. The pathway from the sense amplifier 350a to the bit line includes conductive pathway 1052, bond pad 574b, bond pad 570b, and conductive pathway 1054. Sense amplifier 350b is in communication with a bit line in memory die 302b. The pathway from the sense amplifier 350b to the bit line includes conductive pathway 1054, TSV 1056, bond pad 576b, bond pad 572b, and conductive pathway 1048.

Numerous modification to an embodiment depicted in FIG. 10B are possible. One modification is for sense amplifiers 350a to be located on first memory die 302a, and for sense amplifiers 350b to be located on second memory die 302b.

Figure 11:
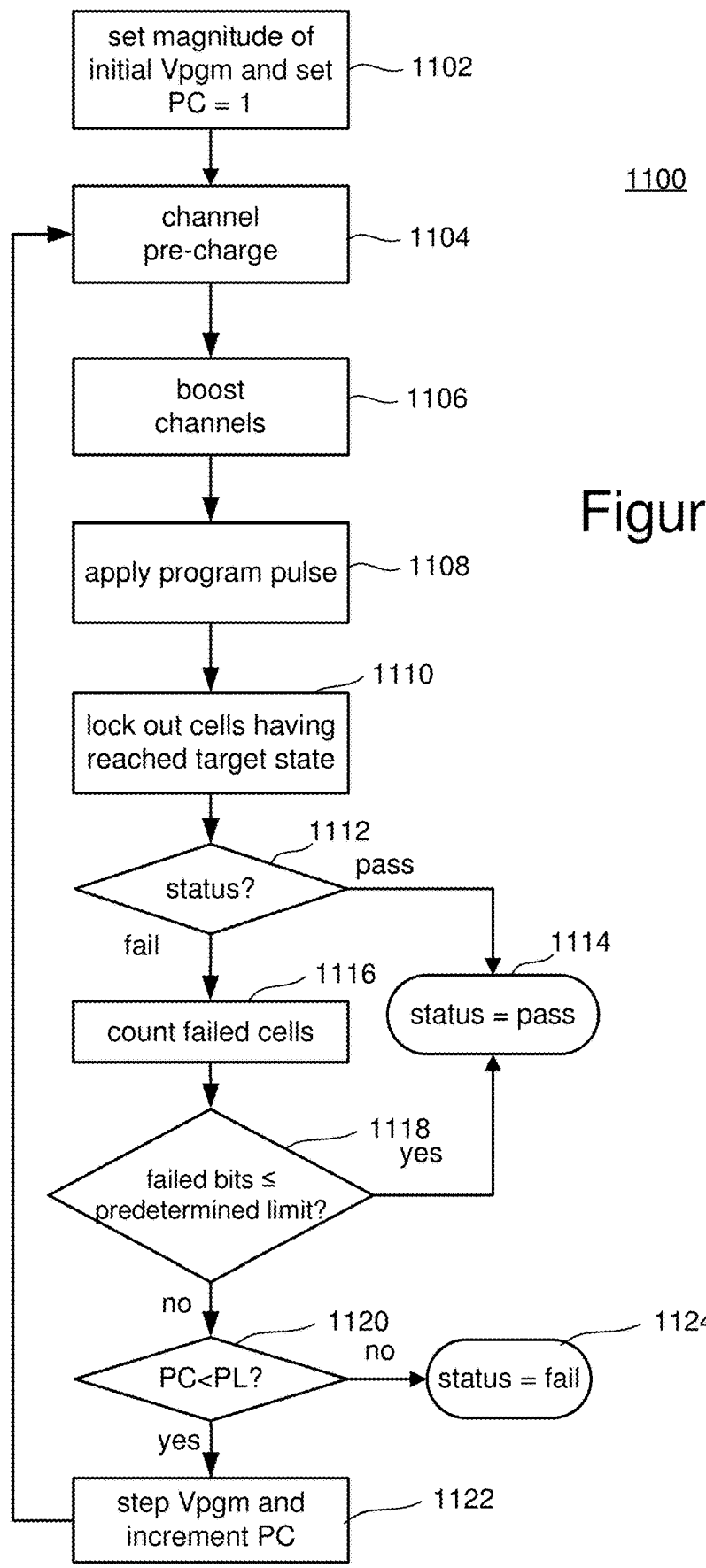
FIG. 11 is a flowchart describing one embodiment of a process for programming NAND strings of memory cells organized into an array.

FIG. 11 is a flowchart describing one embodiment of a process 1100 for programming NAND strings of memory cells organized into an array. In one example embodiment, the process of FIG. 11 is performed on integrated memory assembly 104 using the control circuitry 310 discussed above. For example, the process of FIG. 11 can be performed at the direction of state machine 312. In one embodiment, process 1100 is used to program a codeword into memory structure 326.

In many implementations, the magnitude of the program pulses is increased with each successive pulse by a predetermined step size. In step 1102 of FIG. 11, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1104 the memory system will pre-charge channels of NAND strings that include memory cells connected to the selected word line that are to be inhibited from programming.

In step 1106, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1108, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 1108, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1110, memory cells that have reached their target states are locked out from further programming. Step 1110 may include performing verifying at one or more verify reference levels. In one embodiment, the verification process is performed by testing whether the threshold voltages of the memory cells selected for programming have reached the appropriate verify reference voltage.

In step 1110, a memory cell may be locked out after the memory cell has been verified (by a test of the Vt) that the memory cell has reached its target state.

If, in step 1112, it is determined that all of the memory cells have reached their target threshold voltages (pass), the programming process is complete and successful because all selected memory cells were programmed and verified to their target states. A status of "PASS" is reported in step 1114. Otherwise if, in step 1112, it is determined that not all of the memory cells have reached their target threshold voltages (fail), then the programming process continues to step 1116.

In step 1116, the memory system counts the number of memory cells that have not yet reached their respective target threshold voltage distribution. That is, the system counts the number of memory cells that have, so far, failed to reach their target state. This counting can be done by the state machine, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1118, it is determined whether the count from step 1116 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1114. In this situation, enough memory cells programmed correctly such that the few remaining memory cells that have not been completely programmed can be corrected using ECC during the read process. In some embodiments, the predetermined limit used in step 1118 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1120 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1124. If the program counter PC is less than the program limit value PL, then the process continues at step 1122 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1122, the process loops back to step 1104 and another program pulse is applied to the selected word line so that another iteration (steps 1104-1122) of the programming process of FIG. 11 is performed.

At the end of a successful programming process, the threshold voltages of the memory cells should be within one or more distributions of threshold voltages for programmed memory cells or within a distribution of threshold voltages for erased memory cells, as appropriate. FIG. 12A illustrates example threshold voltage distributions for the memory array when each memory cell stores three bits of data. Other embodiments, however, may use other data capacities per memory cell (e.g., such as one, two, four, or five bits of data per memory cell). FIG. 12A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 12A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 12A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 12A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 12A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 12A) or verify operation (e.g. see verify target levels VvA, VvB, VvC, VvD, VvE, VvF, and VvG of FIG. 12A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 12B depicts threshold voltage distributions when each memory cell stores four bits of data. FIG. 12B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects.

As noted, FIG. 12B depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11. In some embodiments, the read reference voltages that are used to read a page are adjusted from time to time. In some embodiments, a tiered approach is taken in which the control die 304 uses one or more techniques to seek new read reference voltages. If the control die is unsuccessful at finding satisfactory read reference voltages, the memory controller 102 may seek new read reference voltages.

FIG. 13 is a flowchart of one embodiment of a process 1300 of operating non-volatile memory that includes an integrated memory assembly 104. Process 1300 may be used to determine new read reference voltages for reading memory cells on the memory die 302. Process 1300 could be performed in response to a number of triggers such as, but not limited to, a UECC error, a BER being above a threshold, decoding time being above threshold, etc. A UECC error means that a decoder was unable to successfully decode a codeword. This could apply to a decoder on the control die 304 or a decoder in the memory controller 102.

Process 1300 employs a tiered approach for determining new read reference voltages in which first the control die 304 attempts to determine the new read reference voltages, and then the memory controller 102 attempts to determine the new read reference voltages. The control die 304 and the memory controller 102 may use different techniques to determine the new read reference voltages. In one embodiment, the technique used by the memory controller 102 may consume more time and/or power than the technique used by the control die 304.

Step 1302 includes circuitry 310 on the control die 304 calibrating read reference voltages. For the sake of discussion, the control die 304 uses a first technique. The control die 304 may use more than one technique to calibrate the read reference voltages.

In one embodiment, the control die 304 uses a technique that analyzes threshold voltage distributions. In one embodiment, the control die 304 performs a scan for a valley between two threshold voltage distributions. The new read reference voltage may be at the valley. The valley refers to the location between two adjacent threshold voltage distributions that has a minimum number of memory cells. For example, FIG. 12B shows a valley between data state S3 and data state S4. In one embodiment, the new read reference voltage is established at the valley.

In one embodiment, the valley scan includes reading a various levels near the present read reference voltage. For example, with respect to FIG. 12B, the valley scan could read successively at [Vr4−3Δ, Vr4−2Δ, Vr4−Δ, Vr4, Vr4+Δ, Vr4+2Δ, Vr4+3Δ]. With each new read, the number of memory cells whose state "flips" can be counted. In other words, a count is made of the number of memory cells that transition from not conducting (i.e., having a threshold voltage above the read reference voltage) to conducting (i.e., having a threshold voltage below the read reference voltage). In one embodiment, the valley is selected based on the location having the fewest such transitions. For example, the new read reference voltage can be selected as the read reference voltage that had the fewest such transitions. Other techniques may be used to perform a valley scan.

In one embodiment, the control die 304 compares the number of memory cells in a threshold voltage distribution to an expected number of memory cells to be in that threshold voltage distribution. In one embodiment, the approximate number of memory cells in each of the data states is known. For example, as a result of data scrambling (or other factors), the number of memory cells in each data state may be approximately the same. With reference to FIG. 12B, in one embodiment, approximately one eighth of the memory cells should be below VrA, two eighths of the memory cells should be below VrB, three eighths of the memory cells should be below VrC, etc. In one embodiment, for each read reference voltage (e.g., VrA, VrB, VrC, etc.) the control die 304 reads at various candidate reference voltages that are near that reference level, and selects the candidate that has results that are closest to the aforementioned ratios.

In one embodiment, the control die 304 uses a technique that analyzes an error metric with respect to data stored in the non-volatile memory cells. The error metric may be, for example, a syndrome weight or a bit error rate (BER). The control die 304 may analyze an error metric of a codeword that is read from a set of the non-volatile memory cells. In one embodiment, the control die 304 performs a bit error rate estimation scan (BES) to determine the new read reference voltages. Briefly, the BES may include sensing memory cells using different sets of read reference voltages, and then determining an error metric such as a BER for each set of read reference voltages.

For example, with respect to the example in FIG. 12B, there are seven candidate read reference voltages for each of the four read reference voltages that are used to sense the lower page. This means that there are a total of 7^4 possible combinations of read reference voltages for reading the lower page. However, the control die 304 may explore only a very limited number of these combinations, thereby saving both time and power. Also, the circuitry needed to perform the calculations may be simplified. In one embodiment, multiple candidate reference levels are used for one read reference voltage, with the other read reference voltages fixed. This technique vastly reduces the number of sense operations. For example, with respect to the example in FIG. 12B, if only one of the possible read reference voltages is used for three of the read reference voltages, then this leaves just seven possible combinations. For example, one combination may be [Vr1−5Δ, Vr4, Vr6, Vr11], another combination may be [Vr1−2Δ, Vr4, Vr6, Vr11], still another combination may be [Vr1−Δ, Vr4, Vr6, Vr11], and so on. If only the reference voltages are Vr1 are allowed to vary, this limits the possible combinations to seven. However, the control die 304 may form similar sets for the other read reference voltages (Vr4, Vr6, Vr11) used to read the lower page. The control die may also calibrate read reference voltages for reading at the other three pages (e.g., lower-middle, upper-middle, upper). Further details of one embodiment of a first phase of BES are shown and described with respect to FIG. 17.

Step 1304 is a determination of whether the control die 304 was successful at calibrating the read reference voltages. In one embodiment, the error metric should be below a target threshold to indicate success.

If the control die 304 was successful at calibrating the read reference voltages, then the control die 304 stores the new (or calibrated) read reference voltages, in step 1306. Note that the memory controller 102 does not need to be involved up to this point. Hence, data need not be transferred from the control die 304 to the memory controller 102 up to this point.

If the control die 304 was not successful at calibrating the read reference voltages, then steps 1308-1314 are performed. Step 1308 includes the control die 304 requesting the memory controller 102 to calibrate the read reference voltages. Step 1310 includes the memory controller 102 calibrating the read reference voltages. The memory controller 102 may use a second technique, which is different from a technique used by the control die 304. In one embedment, the memory controller 102 uses a technique that analyzes an error metric with respect to data stored in the non-volatile memory cells. For example, the memory controller 102 may use a type of BES. However, the memory controller 102 may perform a more exhaustive or comprehensive BES than was performed by the control die 304. For example, with respect to the example in FIG. 12B, there are seven candidate read reference voltages for each of the four read reference voltages that are used for the lower page. This means that there are a total of 7^4 possible combinations of read reference voltages for reading the lower page. The exhaustive BES does not necessarily explore all of these 7^4 possible combinations, but may explore many more combinations than are explored by the control die 304. In one embodiment, the memory controller 102 explores sets of reference voltages for reading a page, wherein multiple candidates are allowed for more than one read reference voltage. Further details of one embodiment of a second phase of BES are shown and described with respect to FIG. 18.

Step 1312 includes the memory controller 102 sending the new read reference voltages to the control die 304. Step 1314 includes the control die 304 storing the new read reference voltages.

Figure 14:
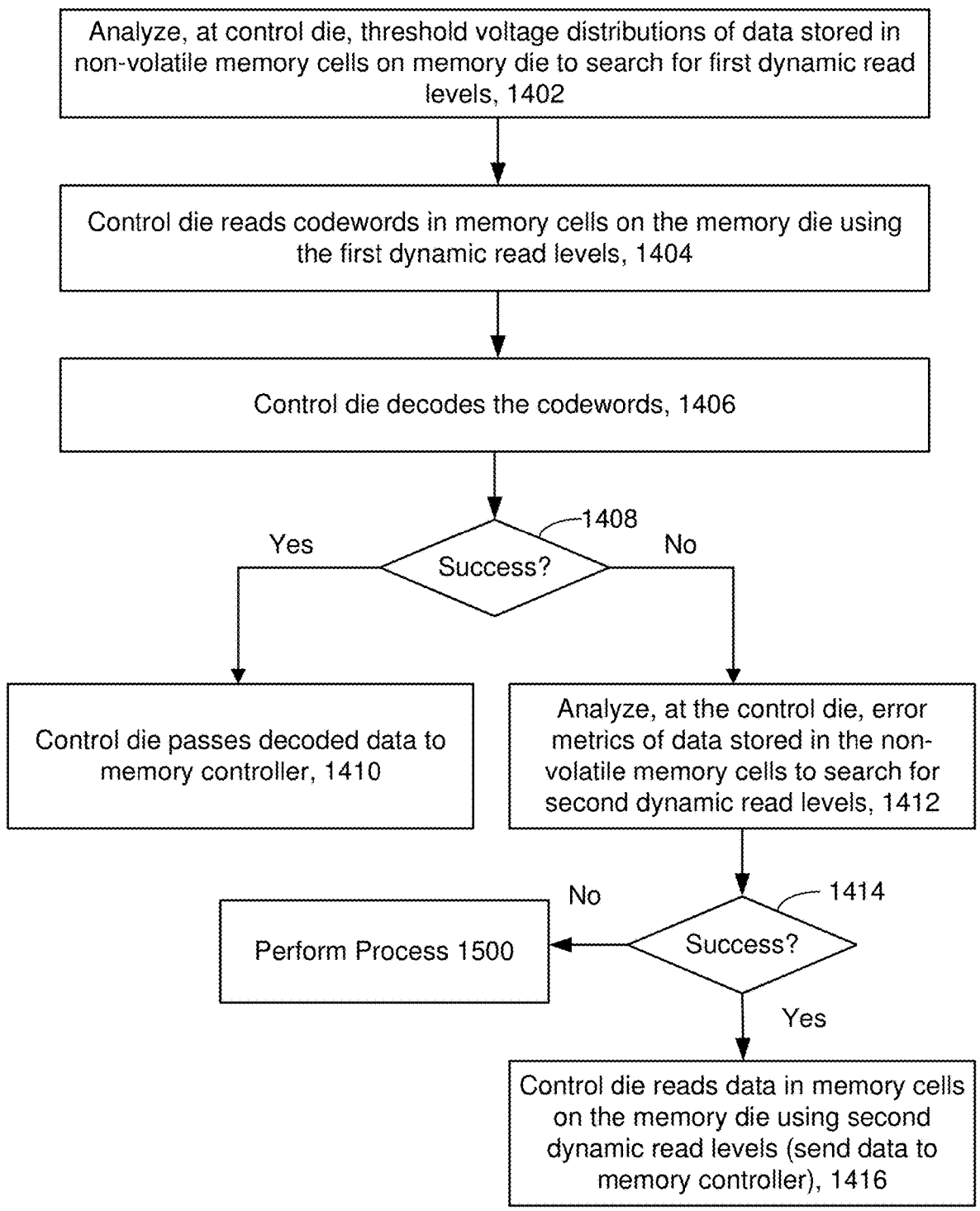
FIG. 14 is a flowchart of one embodiment of a process of operating non-volatile memory that includes an integrated memory assembly.

FIG. 14 is a flowchart of one embodiment of a process 1400 of operating non-volatile memory that includes an integrated memory assembly 104. Process 1400 may be used to determine new read reference voltages for reading memory cells on the memory die 302. Process 1400 could be performed in response to a number of triggers such as, but not limited to, a UECC error, a BER being above a threshold, decoding time being above threshold, etc. Process 1400 employs a tiered approach for determining new read reference voltages at a control die 304.

Process 1400 involves using different techniques on the control die 304 to determine new read reference voltages. In process 1400 one of the techniques is based on analyzing threshold voltage distributions, and another technique involves analyzing error metrics.

Step 1402 includes analyzing threshold voltage distributions of data stored in the non-volatile memory cells on the memory die 302 in order to search for a first set of dynamic read reference voltages. Analyzing threshold voltage distributions can be performed without any decoding of codewords. In some embodiments, analyzing threshold voltage distributions can make use of existing hardware that is used to sense the memory cells. For example, with reference to FIG. 5A, in one embodiment, the control die 304 has sense amplifiers 350 and other logic that allows the control die 304 to analyze threshold voltage distributions. Hence, analyzing threshold voltage distributions to determine new read reference voltages can be performed with a minimal of additional logic added to the integrated memory assembly 104. Examples of analyzing threshold voltage distributions to determine new read reference voltages have been discussed above in connection with step 1302. In one embodiment, the control die 304 performs a scan for a valley between two threshold voltage distributions. In one embodiment, the control die 304 compare ratios of numbers of memory cells having a threshold voltage below a selected read reference voltage to an expected number of memory cells that are to have a threshold voltage below the selected read reference voltage.

Step 1404 may include the control die 304 reading codewords stored in a group of memory cells using the new read reference voltages. Step 1406 may include the control die 304 attempting to decode the codewords.

Step 1408 includes determining whether the new read reference voltages are satisfactory. In other words, it is determined whether determining whether the new read reference voltages was successful. Whether the new read reference voltages are satisfactory may be determined based on an error metric of codewords (e.g., data) that are read using the new read reference voltages. In one embodiment, the new read reference voltages are satisfactory if an error metric (for data or a codeword) is within a threshold. The new read reference voltages are unsatisfactory if an error metric is outside of the threshold. For example, success may be determined based on whether a syndrome weight of a codeword is below a threshold, whether an estimated BER of a codeword is below a threshold, or other factors. In one embodiment, the syndrome weight is within a threshold if the syndrome weight is below a pre-determined value. In one embodiment, the BER is within a threshold if the syndrome weight is below a pre-determined value.

If the new read reference voltages are satisfactory, then the control die 304 passes the decoded data to the memory controller 102 in step 1410. The control die 304 may also store the first dynamic read levels for future use.

If the new read reference voltages are not satisfactory, then steps 1412-1416 are performed. Step 1412 includes the control die 304 analyzing error metrics of data stored in non-volatile memory cells on the memory die 302 to search for second dynamic read levels.

Step 1414 includes a determination of whether the second dynamic read levels are satisfactory. If the second dynamic read levels are satisfactory (step 1414 is yes), then the control die 304 uses the second dynamic read levels to read data in the memory cells on the memory die 302. The control die 304 may decode the data, and send the decoded data to the memory controller 102. The control die 304 may also store the second dynamic read levels for future use.

If the second dynamic read levels are not satisfactory (step 1414 is no), then process 1500 may be performed. Process 1500 is shown in FIG. 15.

Figure 15:
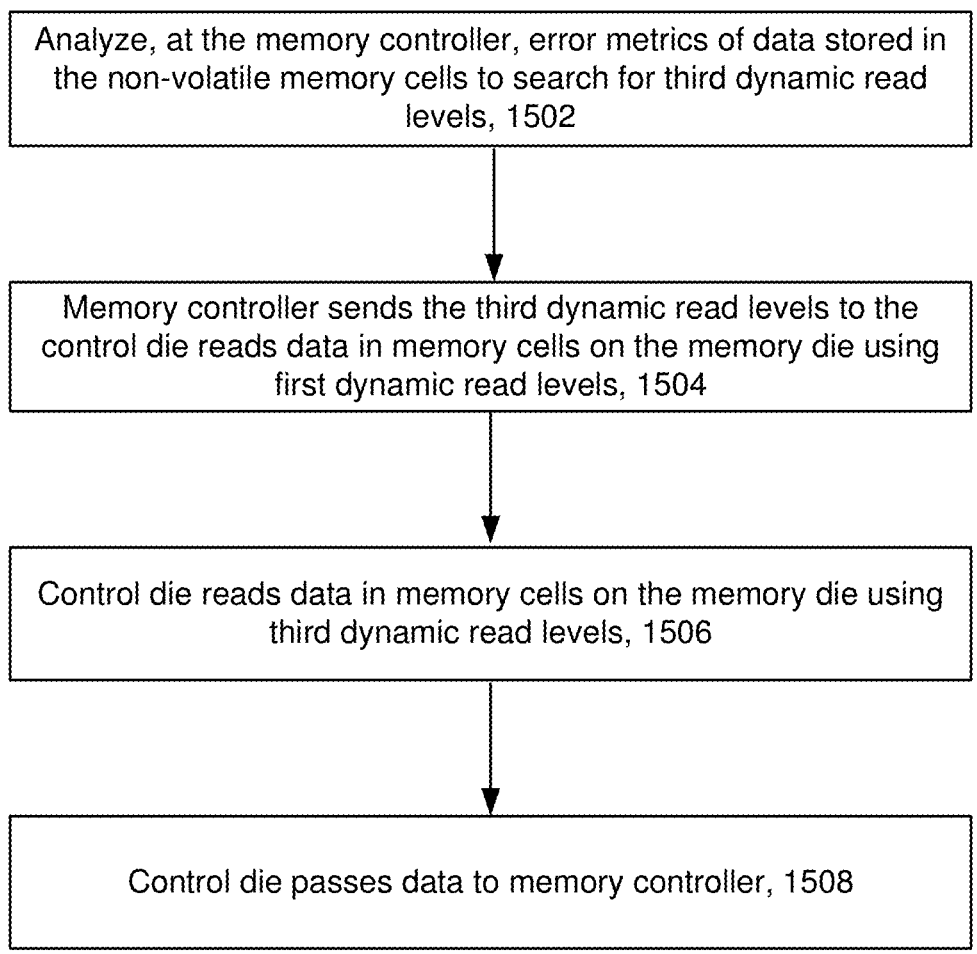
FIG. 15 is a flowchart of one embodiment of a process of operating non-volatile memory that includes an integrated memory assembly.

FIG. 15 is a flowchart of one embodiment of a process 1500 of operating non-volatile memory that includes an integrated memory assembly 104. Process 1500 may be used to determine new read reference voltages for reading memory cells on the memory die 302. Process 1500 could be performed in response to process 1400 failing to determine dynamic read levels that are satisfactory.

Step 1502 includes the memory controller 102 determining error metrics of data stored in the non-volatile memory cells on the memory die 302 in order to search for dynamic read levels. In one embodiment, the memory controller 102 performs a second phase of a BES process. Details of one embodiment of a second phase of a BES process are shown and described with respect to FIG. 18.

Step 1504 includes the memory controller 102 sending the third dynamic read levels to the control die 304. The control die 304 may store the third dynamic read levels for future use.

Step 1506 includes the control die using the third sets of dynamic read levels to read data in the non-volatile memory cells on the memory die 302. Step 1506 may also include the control die 304 decoding the data.

Step 1508 includes the control die 304 passing the data to the memory controller 102.

Figure 16:
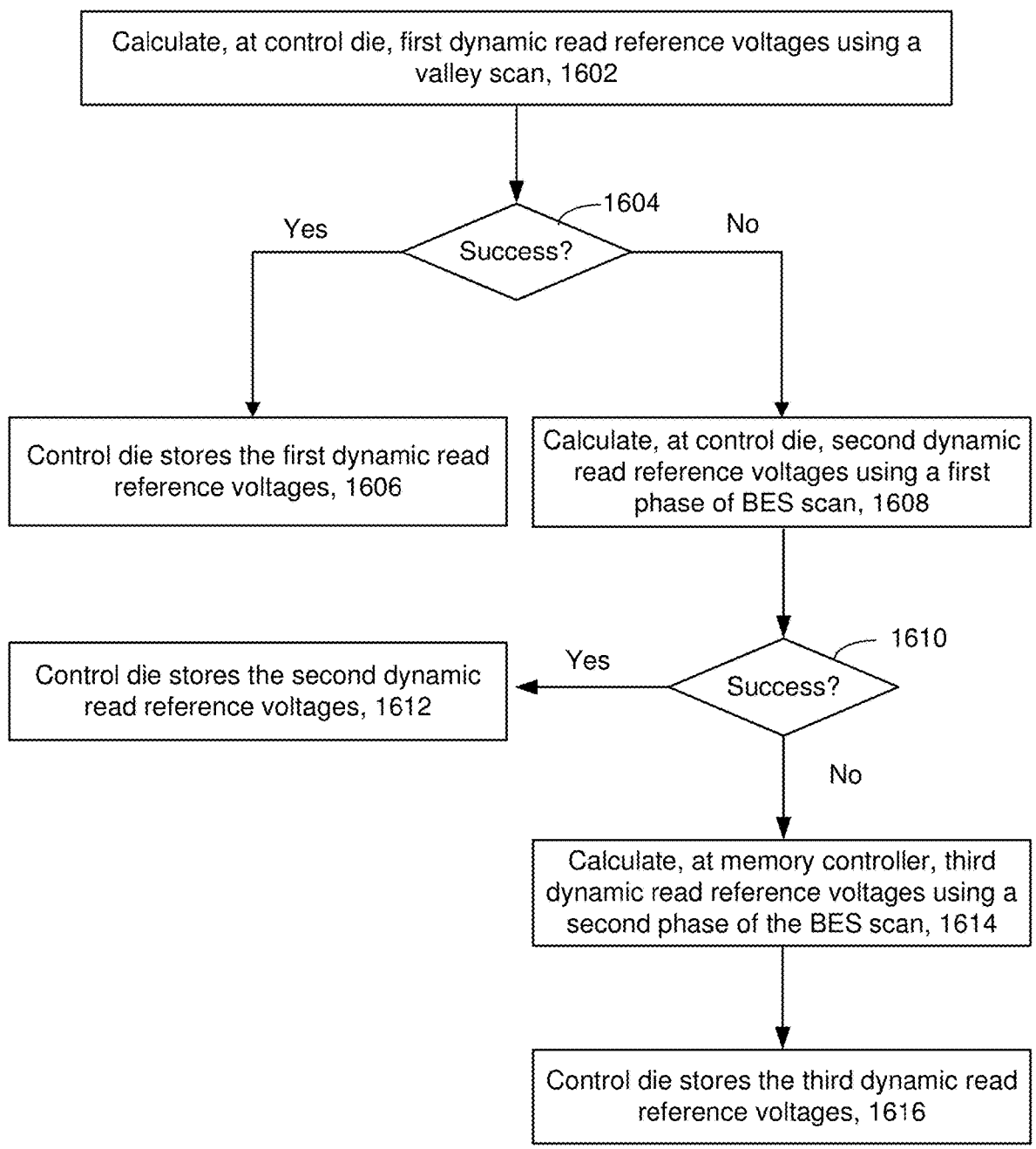
FIG. 16 is a flowchart of one embodiment of a process of determining dynamic read reference voltages for memory cells in an integrated memory assembly.

In one embodiment, a tiered approach to determining dynamic read levels includes performing a valley scan, performing a first phase of a BES scan, and then performing a second phase of a BES scan, as needed to determine dynamic read levels. FIG. 16 is a flowchart of one embodiment of a process 1600 of determining dynamic read levels for memory cells in an integrated memory assembly 104. Process 1600 may be used to determine new read reference voltages for reading memory cells on the memory die 302. Process 1600 could be performed in response to a number of triggers such as, but not limited to, a UECC error, a BER being above a threshold, decoding time being above threshold, etc. Process 1600 employs a tiered approach for determining new read reference voltages at a control die 304.

Step 1602 includes performing a valley scan of threshold voltage distributions of data stored in the non-volatile memory cells on the memory die 302 in order to search for a first set of dynamic read reference voltages. Performing the valley scan can be performed without any decoding of codewords. In some embodiments, performing the valley scan can be make use of existing hardware that is used to sense the memory cells. Hence, performing the valley scan to determine new read reference voltages can be performed with a minimal of additional logic added to the integrated memory assembly 104.

Step 1604 includes a determination of whether the valley scan was successful. If the valley scan was successful, then the first set of dynamic read levels may be stored on the control die 304, in step 1606. If the valley scan was not successful, then control passes to step 1608.

Step 1608 includes the control die 304 performing a first phase of a BES scan to determine a second set of dynamic read levels. If the first phase of the BES scan was successful (step 1610 is yes), then the second set of dynamic read levels may be stored on the control die 304, in step 1612. If the first phase of the BES scan was not successful (step 1610 is no), then control passes to step 1614. Step 1614 includes the memory controller 102 performing a second phase of the BES scan to determine a third set of dynamic read levels. Step 1616 includes the control die 304 storing the third set of dynamic read levels.

Many variations of process 1600 are possible. In some embodiments, additional tiers could be added. In some embodiments, not all tiers are performed. For example, one of techniques in step 1602, 1606, or 1614 might be skipped. In some embodiments, the technique at one tier is replaced with another technique. For example, the valley scan in step 1602 might be replaced by another technique, such as comparing ratios of the number of memory cells in each threshold voltage distribution.

Figure 17:
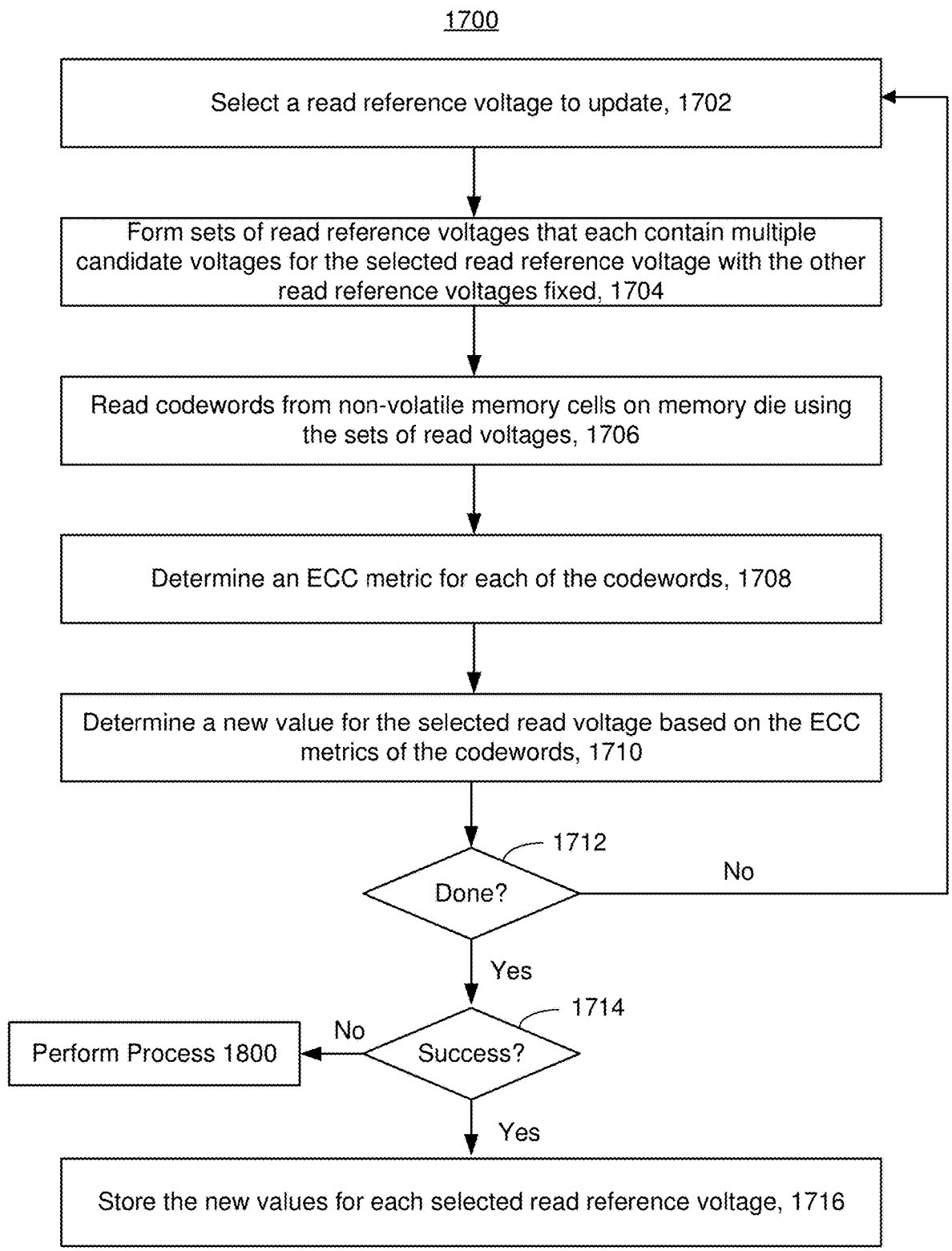
FIG. 17 is a flowchart of one embodiment of a first phase of a bit error rate estimation scan to determine new read reference voltages.
Figure 18:
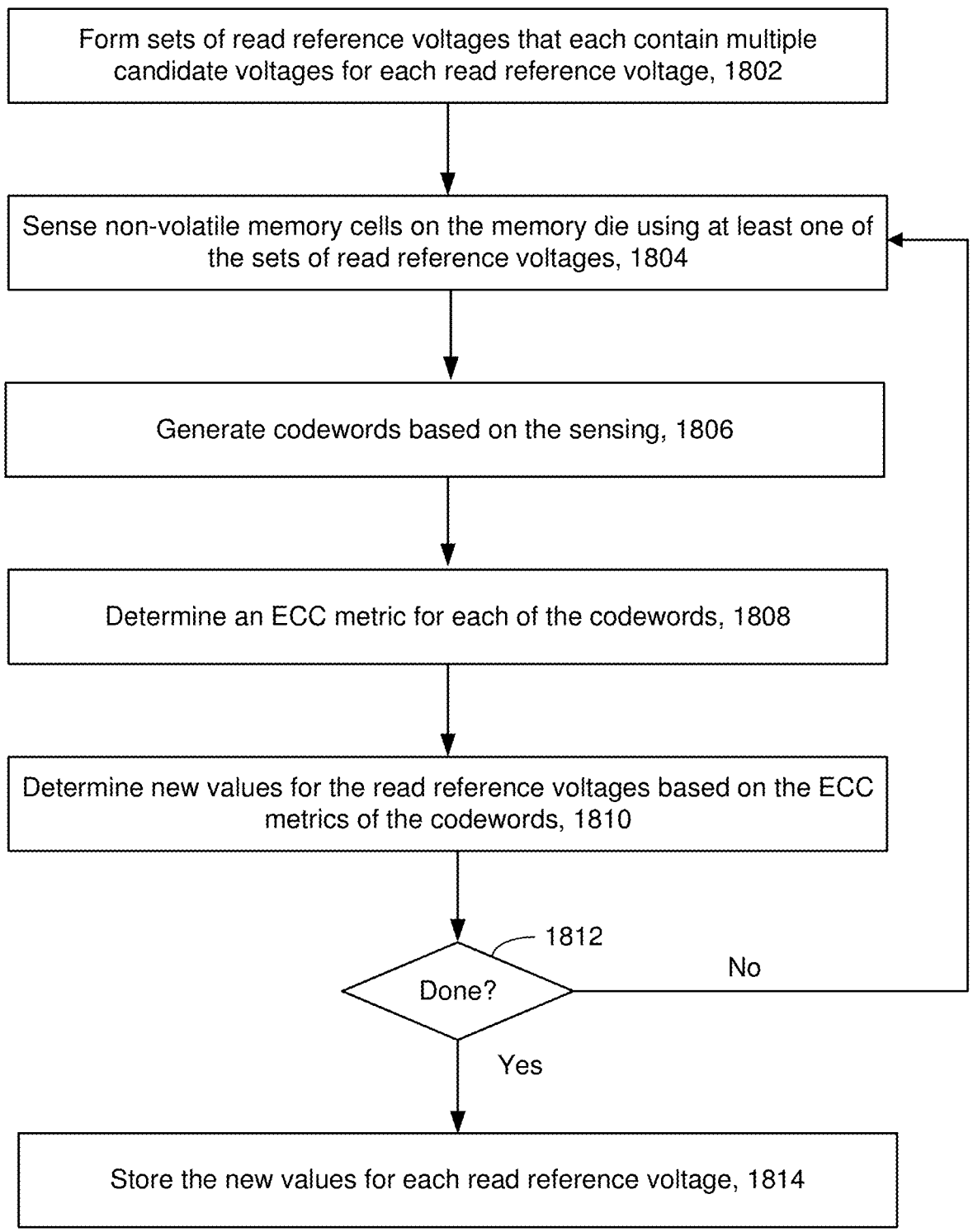
FIG. 18 is a flowchart of one embodiment of a second phase of the bit error rate estimation scan of FIG. 17 to determine new read reference voltages.

Some embodiments analyze an error metric to determine new read reference voltages. One technique for analyzing error metrics is referred to herein as BES. In some embodiments, the BES has a first phase and a second phase. The first phase may in some embodiments be referred to as a greedy phase. The second phase may in some embodiments be referred to as an exhaustive or comprehensive phase. FIG. 17 is a flowchart of one embodiment of a first phase of a BES to determine new read reference voltages. FIG. 18 is a flowchart of one embodiment of a second phase of a BES to determine new read reference voltages.

With reference now to FIG. 17, the first phase of the BES may be performed on the control die 304. Reference will be made to the example threshold distributions in FIG. 12B to facilitate discussion of process 1700 in FIG. 17. Process 1700 may be used for the read reference voltages that are used to sense one page. Process 1700 may be used to update Vr1, Vr4, Vr6, and Vr11, which in one embodiment are used to sense the lower page. Process 1700 may be repeated for other pages.

Step 1702 includes selecting a read reference voltage to update. With reference to FIG. 12B, read reference voltage Vr1 may be selected.

Step 1704 includes forming sets of read reference voltages that each contain multiple candidate voltages for the selected read reference voltage with the other read reference voltages fixed. For example, the sets may include the following: [Vr1−3Δ, Vr4, Vr6, Vr11], [Vr1−2Δ, Vr4, Vr6, Vr11], [Vr1−Δ, Vr4, Vr6, Vr11], [Vr1, Vr4, Vr6, Vr11], [Vr1+Δ, Vr4, Vr6, Vr11], [Vr1+2Δ, Vr4, Vr6, Vr11], and [Vr1+3Δ, Vr4, Vr6, Vr11]. Thus, seven sets may be formed in this example. More or fewer than seven sets could be formed in step 1704. Note that seven sets is a relatively small number of sets compared to the 7^4 possible sets of read reference voltages for the example in FIG. 12B.

Step 1706 includes reading codewords from non-volatile memory cells on the memory die 302 using the sets of read reference voltages. In the present example, seven codewords may be read (one for each set in step 1704). The following describes how one codeword may be read. The memory cells may be sensed successively at each of the following reference voltages [Vr1−3Δ, Vr4, Vr6, Vr11]. As each reference voltage is applied to a selected memory cell, the selected memory cell might or might not conduct a current. A latch may be used to store an indication of whether the selected memory cell conducts a current for that reference voltage. In one embodiment, a single bit is generated for the selected memory cell based on the results of sensing at all of the reference voltages in the set. The codeword is thus formed from the results of sensing a set of memory cells.

Step 1708 includes determining an ECC metric for each codeword that was read in step 1706. In one embodiment, the ECC metric is a syndrome weight. This may be the initial syndrome weight. In one embodiment, the initial syndrome weight is determined by performing one iteration of decoding in an iterative message passing decoder. In one embodiment, the ECC metric is an estimated BER. In one embodiment the BER is estimated based on the initial syndrome weight. Thus, note that the codeword need not be completely decoded in order to determine the ECC metric.

Step 1710 includes determining a new value for the selected read voltage based on the ECC metric for the codewords. For example, the set of read reference voltages that produced the codeword having the best ECC metric may be selected. The best ECC metric refers to the best performance. For syndrome weight a lower weight is better. In other words, having fewer unsatisfied check nodes is better. For BER, the lowest BER is the best. If there are ties any suitable tiebreaking procedure can be used, such as selecting the value that is closest to the present read reference voltage. Note that step 1710 only determines a new read reference voltage for one selected in step 1704.

Step 1712 includes a determination of whether another read reference voltage should be analyzed. Assuming the process is not done, the process repeats steps 1702-1710 for another of the read reference voltages that are used to sense the page. For example, with reference to FIG. 12B, the sets may include the following: [Vr1*, Vr4−3Δ, Vr6, Vr11], [Vr1*, Vr4−2Δ, Vr6, Vr11], [Vr1*, Vr4−Δ, Vr6, Vr11], [Vr1*, Vr4, Vr6, Vr11], [Vr1*, Vr4+Δ, Vr6, Vr11], [Vr1*, Vr4+2Δ, Vr6, Vr11], and [Vr1*, Vr4+3Δ, Vr6, Vr11]. In this example, Vr1* is the new value for Vr1.

In one embodiment, steps 1702-1710 are repeated for each of the read reference voltages that are used to sense the page. However, it is not required that process 1700 repeat steps 1702-1710 for each of the read reference voltages that are used to sense the page. In other words, optionally one or more of the read reference voltages could be left unchanged without an attempt to seek a new value. In one embodiment, steps 1702-1710 are performed more than once for at least one of the read reference voltages. For example, steps 1702-1710 could be performed until the ECC metric in step 1708 is sufficiently low.

After the process is done determining new read reference voltages (step 1712 is yes), a determination is made as to whether the process was successful, in step 1714. In one embodiment, in the event that the ECC metric in step 1708 does not reach a target level within a certain number of iterations, the process 1700 ends with a failed status. In other words, the process 1700 concludes with a determination that the new read reference voltages are not satisfactory. In one embodiment, if process 1700 concludes with a determination that the new read reference voltages are not satisfactory, then process 1800 is performed.

If the process was successfully at finding new read reference voltages (step 1714 is yes), then the control die 304 stores the new read reference voltages, at step 1716.

With reference now to FIG. 18, the second phase of the BES may be performed on the memory controller 102. Reference will be made to the example threshold distributions in FIG. 12B to facilitate discussion of process 1800 in FIG. 18. Process 1800 may be used for the read reference voltages that are used to sense one page. Process 1800 may be used to update Vr1, Vr4, Vr6, and Vr11, which in one embodiment are used to sense the lower page. Process 1800 may be repeated for other pages.

Step 1802 includes forming sets of read reference voltages that each contain multiple candidate voltages for each read reference voltage that is used to sense a page. For example, with reference to FIG. 12B, there are 7^4 possible sets of read reference voltages. Note that process 1800 does not require sensing for each of these 7^4 possible sets.

Step 1804 includes sensing non-volatile memory cells on the memory die 304 using at least one of the sets of read reference voltages.

Step 1806 includes generating codewords based on the sensing of step 1804.

Step 1808 includes determining an ECC metric for each codeword. In one embodiment, the ECC metric is a syndrome weight. This may be the initial syndrome weight. In one embodiment, the initial syndrome weight is determined by performing one iteration of decoding in an iterative message passing decoder. In one embodiment, the ECC metric is an estimated BER. In one embodiment the BER is estimated based on the initial syndrome weight. Thus, note that the codeword need not be completely decoded in order to determine the ECC metric.

Step 1810 includes determining new values for the read reference voltages based on the ECC metric for the codewords. For example, the set of read reference voltages that produced the codeword having the best ECC metric may be selected. The best ECC metric refers to the best performance. For syndrome weight a lower weight is better. In other words, having fewer unsatisfied check node is better. For BER, the lowest BER is the best. If there are ties any suitable tiebreaking procedure can be used, such as selecting the value that is closest to the present read reference voltage.

Step 1812 includes a determination of whether the search for new read reference voltages is complete. In one embodiment, step 1812 is based on whether the syndrome weight of the codewords in step 1806 is below a threshold. If the syndrome weight is not below the threshold, the process may repeat steps 1804-1810 for other sets of read reference voltages. When it is determined (in step 1812) that sufficient accuracy has been achieved for the read reference voltages, then the new read reference voltages are stored, in step 1814.

A first embodiment includes an apparatus comprising a first semiconductor die comprising non-volatile memory cells and a first plurality of pathways. The apparatus further comprises a second semiconductor die comprising one or more control circuits and a second plurality of pathways. The one or more control circuits are configured to transfer signals through pathway pairs of the first plurality of pathways and the second plurality of pathways. The one or more control circuits are further configured to read data in the non-volatile memory cells using read reference voltages. The one or more control circuits are configured to receive the data in parallel from the first semiconductor die through the second plurality of pathways. The one or more control circuits are configured to calibrate read reference voltages for reading the non-volatile memory cells. The one or more control circuits are configured to use the calibrated read reference voltages to read data in the non-volatile memory cells.

In a second embodiment, in furtherance of the first embodiment, the apparatus further comprises a memory controller in communication with the one or more control circuits on the second semiconductor die through a communication channel external to the second semiconductor die. The memory controller comprises a control circuit configured to calibrate the read reference voltages responsive to the read reference voltages calibrated by the one or more control circuits on the second semiconductor die being unsatisfactory.

In a third embodiment, in furtherance of the first or second embodiments, the one or more control circuits on the control die are further configured to determine an error metric of a codeword stored in the non-volatile memory cells. The one or more control circuits on the control die are further configured to calibrate the read reference voltages based on the error metric.

In a fourth embodiment, in furtherance of any of the first to third embodiments, the one or more control circuits on the control die are further configured to form sets of read reference voltages that each contain multiple candidate voltages for a selected read reference voltage with other read reference voltages fixed. The one or more control circuits on the control die are further configured to read codewords from a set of the non-volatile memory cells on the memory die using the sets of the read reference voltages. The one or more control circuits on the control die are further configured to determine an error metric for each of the codewords. The one or more control circuits on the control die are further configured to calibrate the selected read reference voltage based on the error metrics for the codewords.

In a fifth embodiment, in furtherance of any of the first to fourth embodiments, the apparatus further comprises further comprises a memory controller in communication with the one or more control circuits on the second semiconductor die through a communication channel external to the second semiconductor die. The memory controller comprises a control circuit configured to determine an error metric for each of a plurality of sets of read reference voltages in which each set includes a plurality of candidate read reference voltages for each of a plurality of read reference voltages for reading a codeword. The control circuit of the memory controller is configured to calibrate the read reference voltages based on the error metrics.

In a sixth embodiment, in furtherance of any of the first to fifth embodiments, the second semiconductor die comprises logic is configured to calibrate the read reference voltages based on an analysis of threshold voltage distributions of data stored in a set of the non-volatile memory cells. The second semiconductor die is configured to calibrate the read reference voltages based on an analysis of error metrics of codewords stored in the set of the non-volatile memory cells voltages responsive to the read reference voltages calibrated based on the analysis of the threshold voltage distributions being unsatisfactory.

In a seventh embodiment, in furtherance of any of the first to sixth embodiments, the one or more control circuits on the second semiconductor die are further configured to re-use data used to calibrate the read reference voltages for the set based on analysis of the threshold voltage distributions to calibrate the read reference voltages based on an analysis of the error metrics.

In an eighth embodiment, in furtherance of any of the sixth to seventh embodiments, the one or more control circuits on the second semiconductor die are configured to perform a scan for a valley between two of the threshold voltage distributions to calibrate the read reference voltages based on the analysis of threshold voltage distributions of data stored in the set of the non-volatile memory cells.

In a ninth embodiment, in furtherance of any of the first to eighth embodiments, the one or more control circuits on the second semiconductor die are configured to compare ratios of numbers of memory cells having a threshold voltage below a selected read reference voltage to an expected number of memory cells that are to have a threshold voltage below the selected read reference voltage to calibrate the selected read reference voltage based on the analysis of threshold voltage distributions of data stored in the set of the non-volatile memory cells.

In a tenth embodiment, in furtherance of any of the first to ninth embodiments, the first semiconductor die comprises a first plurality of bond pads. Also, the second semiconductor die comprises a second plurality of bond pads. Each pathway pair comprises a bond pad of the first plurality of bond pads and a bond pad of the second plurality of bond pads.

One embodiment includes a method of calibrating read reference voltages. The method comprises analyzing, by one or more control circuits on a control die of an integrated memory assembly that comprises a memory die and the control die, threshold voltage distributions of data stored in non-volatile memory cells on the memory die to search for first dynamic read levels. The method comprises transferring codewords read from the non-volatile memory cells using the first dynamic read levels to the control die, including transferring the codewords from the memory die to the control die through bond pads that bond the memory die to the control die. The method comprises analyzing, by the one or more control circuits on the control die, error metrics of data stored in non-volatile memory cells on the memory die to search for second dynamic read levels responsive to the first dynamic read levels being unsatisfactory. The method comprises transferring data read from the non-volatile memory cells using the second dynamic read levels to from the control die to a memory controller responsive to the second dynamic read levels being satisfactory.

One embodiment includes a non-volatile storage system comprising a memory controller, and an assembly comprising a memory semiconductor die bonded to a control semiconductor die to allow communication between the memory semiconductor die and the control semiconductor die. The assembly is in communication with the memory controller. The memory semiconductor die comprises non-volatile memory cells. The control semiconductor die comprises one or more control circuits configured to read data in the non-volatile memory cells using read reference voltages. The one or more control circuits are configured to calculate new read reference voltages for reading the non-volatile memory cells. The one or more control circuits are configured to read data in the non-volatile memory cells using the new read reference voltages. The one or more control circuits are configured to determine an error metric with respect to the data that was read using the new read reference voltages. The one or more control circuits are configured to pass the data to the memory controller responsive to the error metric being within a threshold. The memory controller is configured to calculate new read reference voltages for reading the non-volatile memory cells responsive to the error metric being outside of the threshold.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a first semiconductor die comprising non-volatile memory cells and a first plurality of pathways; and
a second semiconductor die comprising one or more control circuits and a second plurality of pathways, wherein the one or more control circuits are configured to transfer signals through pathway pairs of the first plurality of pathways and the second plurality of pathways, wherein the one or more control circuits are further configured to:
read data in the non-volatile memory cells using read reference voltages, wherein the one or more control circuits are configured to receive the data in parallel from the first semiconductor die through the second plurality of pathways;
calibrate read reference voltages for reading the non-volatile memory cells; and
use the calibrated read reference voltages to read data in the non-volatile memory cells.

2. The apparatus of claim 1, further comprising:
a memory controller in communication with the one or more control circuits on the second semiconductor die through a communication channel external to the second semiconductor die, wherein the memory controller is configured to calibrate the read reference voltages responsive to the read reference voltages calibrated by the one or more control circuits on the second semiconductor die being unsatisfactory.

3. The apparatus of claim 1, wherein the one or more control circuits on the second semiconductor die are further configured to:
determine an error metric of a codeword stored in the non-volatile memory cells; and
calibrate the read reference voltages based on the error metric.

4. The apparatus of claim 1, wherein the one or more control circuits on the second semiconductor die are further configured to:
form sets of read reference voltages that each contain multiple candidate voltages for a selected read reference voltage with other read reference voltages fixed;
read codewords from a set of the non-volatile memory cells on the first semiconductor die using the sets of the read reference voltages;
determine an error metric for each of the codewords; and
calibrate the selected read reference voltage based on the error metrics for the codewords.

5. The apparatus of claim 4, further comprising:
a memory controller in communication with the one or more control circuits on the second semiconductor die through a communication channel external to the second semiconductor die, wherein the memory controller comprises a control circuit configured to:
determine an error metric for each of a plurality of sets of read reference voltages in which each set includes a plurality of candidate read reference voltages for each of a plurality of read reference voltages for reading a codeword; and
calibrate the read reference voltages based on the error metrics.

6. The apparatus of claim 1, wherein:
the second semiconductor die comprises logic configured to calibrate the read reference voltages based on an analysis of threshold voltage distributions of data stored in a set of the non-volatile memory cells; and
the second semiconductor die is configured to calibrate the read reference voltages based on an analysis of error metrics of codewords stored in the set of the non-volatile memory cells voltages responsive to the read reference voltages calibrated based on the analysis of the threshold voltage distributions being unsatisfactory.

7. The apparatus of claim 6, wherein the one or more control circuits on the second semiconductor die are further configured to:
re-use data used to calibrate the read reference voltages for the set based on analysis of the threshold voltage distributions to calibrate the read reference voltages based on an analysis of the error metrics.

8. The apparatus of claim 6, wherein the one or more control circuits on the second semiconductor die are configured to:
perform a scan for a valley between two of the threshold voltage distributions to calibrate the read reference voltages based on the analysis of threshold voltage distributions of data stored in the set of the non-volatile memory cells.

9. The apparatus of claim 6, wherein the one or more control circuits on the second semiconductor die are configured to:
compare ratios of numbers of memory cells having a threshold voltage below a selected read reference voltage to an expected number of memory cells that are to have a threshold voltage below the selected read reference voltage to calibrate the selected read reference voltage based on the analysis of threshold voltage distributions of data stored in the set of the non-volatile memory cells.

10. The apparatus of claim 1, wherein:
the first semiconductor die comprises a first plurality of bond pads;
the second semiconductor die comprises a second plurality of bond pads; and
each pathway pair comprises a bond pad of the first plurality of bond pads and a bond pad of the second plurality of bond pads.

11. A method of calibrating read reference voltages, the method comprising:
analyzing, by one or more control circuits on a control die of an integrated memory assembly that comprises a memory die and the control die, threshold voltage distributions of data stored in non-volatile memory cells on the memory die to search for first dynamic read levels;
transferring codewords read from the non-volatile memory cells using the first dynamic read levels to the control die, including transferring the codewords from the memory die to the control die through bond pads that bond the memory die to the control die;
analyzing, by the one or more control circuits on the control die, error metrics of data stored in non-volatile memory cells on the memory die to search for second dynamic read levels responsive to the first dynamic read levels being unsatisfactory; and
transferring data read from the non-volatile memory cells using the second dynamic read levels to from the control die to a memory controller responsive to the second dynamic read levels being satisfactory.

12. The method of claim 11, further comprising:
analyzing error metrics at the memory controller to determine third dynamic read levels for reading the non-volatile memory cells on the memory die responsive to the second dynamic read levels being unsatisfactory.

13. The method of claim 11, wherein:
analyzing the threshold voltage distributions comprises performing a valley scan of the threshold voltage distributions;
analyzing the error metrics at the control die comprises the control die performing a greedy phase of a bit error rate (BER) estimation scan; and
analyzing the error metrics at the memory controller comprises the memory controller performing a comprehensive phase of the BER estimation scan.

14. A non-volatile storage system, comprising:
a memory controller; and
an assembly comprising a memory semiconductor die bonded to a control semiconductor die to allow communication between the memory semiconductor die and the control semiconductor die, wherein the assembly is in communication with the memory controller, wherein the memory semiconductor die comprises non-volatile memory cells, wherein the control semiconductor die comprises one or more control circuits configured to:
read data in the non-volatile memory cells using read reference voltages;
calculate new read reference voltages for reading the non-volatile memory cells;
read data in the non-volatile memory cells using the new read reference voltages;
determine an error metric with respect to the data that was read using the new read reference voltages; and
pass the data to the memory controller responsive to the error metric being within a threshold;
wherein the memory controller is configured to calculate new read reference voltages for reading the non-volatile memory cells responsive to the error metric being outside of the threshold.

15. The non-volatile storage system of claim 14, wherein the one or more control circuits on the control semiconductor die are further configured to:
determine an initial syndrome weight of a codeword stored in the non-volatile memory cells; and
calculate the new read reference voltages based on the initial syndrome weight.

16. The non-volatile storage system of claim 14, wherein the one or more control circuits on the control semiconductor die are further configured to:
analyze threshold voltage distributions of data stored in the non-volatile memory cells; and
calculate the new read reference voltages based on the threshold voltage distributions.

17. The non-volatile storage system of claim 14, wherein:
the one or more control circuits on the control semiconductor die are further configured to perform a greedy phase of a technique that uses estimated bit errors of a codeword stored in the non-volatile memory cells in order to calculate the new read reference voltages; and
the memory controller is further configured to perform a comprehensive phase of the technique that uses estimated bit errors of a codeword stored in the non-volatile memory cells in order to calculate the new read reference voltages.

18. The non-volatile storage system of claim 14, wherein:
the one or more control circuits configured to calculate the new read reference voltages comprises an error correction code (ECC) engine configured to decode codewords and a circuit that uses the ECC engine to determine the new read reference voltages.

19. The non-volatile storage system of claim 18, wherein:
the one or more control circuits are configured to calculate the new read reference voltages comprises logic configured to analyze threshold voltage distributions without decoding the codewords.

20. The non-volatile storage system of claim 14, wherein:
the one or more control circuits are configured to calculate the new read reference voltages comprises transistors having a first size; and
the non-volatile memory cells comprise transistors having a second size that is larger than the first size.

* * * * *